United States Patent
Mizuno et al.

(10) Patent No.: US 6,956,607 B2
(45) Date of Patent: Oct. 18, 2005

(54) SOLID-STATE IMAGING DEVICE AND DISTANCE MEASURING DEVICE

(75) Inventors: Seiichiro Mizuno, Hamamatsu (JP); Haruhiro Funakoshi, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 778 days.

(21) Appl. No.: 10/060,167

(22) Filed: Feb. 1, 2002

(65) Prior Publication Data

US 2002/0085104 A1 Jul. 4, 2002

Related U.S. Application Data

(63) Continuation-in-part of application No. PCT/JP00/05284, filed on Aug. 7, 2000.

(30) Foreign Application Priority Data

Aug. 5, 1999  (JP) .......................................... P11-222475

(51) Int. Cl.[7] ............................ H04N 3/14; H04N 5/335
(52) U.S. Cl. ......................... 348/308; 348/294; 348/300
(58) Field of Search .................................. 348/300–308, 348/294, 241; 250/208.1, 214.1, 559.38; 257/229, 239; 341/122, 144, 150, 159–162

(56) References Cited

U.S. PATENT DOCUMENTS

| | | | |
|---|---|---|---|
| 3,898,617 A | | 8/1975 | Kashioka et al. ......... 340/146.3 |
| 4,701,784 A | | 10/1987 | Matsuoka et al. ...... 358/213.17 |
| 5,343,201 A | | 8/1994 | Takayama et al. ........... 341/200 |
| 5,387,933 A | * | 2/1995 | Fouilloy et al. ............. 348/294 |
| 5,479,208 A | * | 12/1995 | Okumura ..................... 348/301 |
| 5,619,262 A | * | 4/1997 | Uno ............................ 348/297 |
| 5,831,258 A | * | 11/1998 | Street ....................... 250/208.1 |
| 6,002,435 A | * | 12/1999 | Yamamoto et al. ......... 348/307 |
| 6,597,007 B2 | * | 7/2003 | Mizuno et al. ........ 250/559.38 |
| 6,606,123 B2 | * | 8/2003 | Mizuno ....................... 348/308 |
| 6,642,501 B2 | * | 11/2003 | Mizuno et al. ......... 250/214 R |
| 6,757,627 B2 | * | 6/2004 | Mizuno ....................... 702/65 |

FOREIGN PATENT DOCUMENTS

| | | |
|---|---|---|
| EP | 0 616 194 A1 | 9/1994 |
| JP | 61 144175 | 7/1986 |
| JP | 1-222583 | 9/1989 |
| JP | 01 222583 | 9/1989 |
| JP | 01 268296 | 10/1989 |
| JP | 1-268296 | 10/1989 |
| JP | 04 322575 | 11/1992 |
| JP | 4-322575 | 11/1992 |
| JP | 05 003554 | 1/1993 |
| JP | 6-276443 | 9/1994 |
| JP | 07 072256 | 3/1995 |
| JP | 10 321830 | 12/1998 |

* cited by examiner

Primary Examiner—Wendy R. Garber
Assistant Examiner—Kelly L. Jerabek
(74) Attorney, Agent, or Firm—Drinker Biddle & Reath LLP

(57) ABSTRACT

A signal current corresponding to an incident light intensity is output from a photodiode PD, the signal current is converted into a signal voltage by an integration circuit 10, and the amount of a change in signal voltage in a predetermined time is output from a CDS circuit 20. The difference between two voltage values output from the CDS circuit 20 is obtained by a difference arithmetic circuit 30 and held by a S-H circuit 40. In addition, the maximum value of voltage values obtained by the difference arithmetic circuits 30 of respective units $100_n$ is obtained by comparison circuits 50 of the respective units $100_n$, a reference signal voltage generation circuit 500, a final coincidence determination circuit 200, and a reference voltage hold circuit 300, and on the basis of the maximum value, the A/D conversion range of an A/D conversion circuit 400 is set.

4 Claims, 12 Drawing Sheets

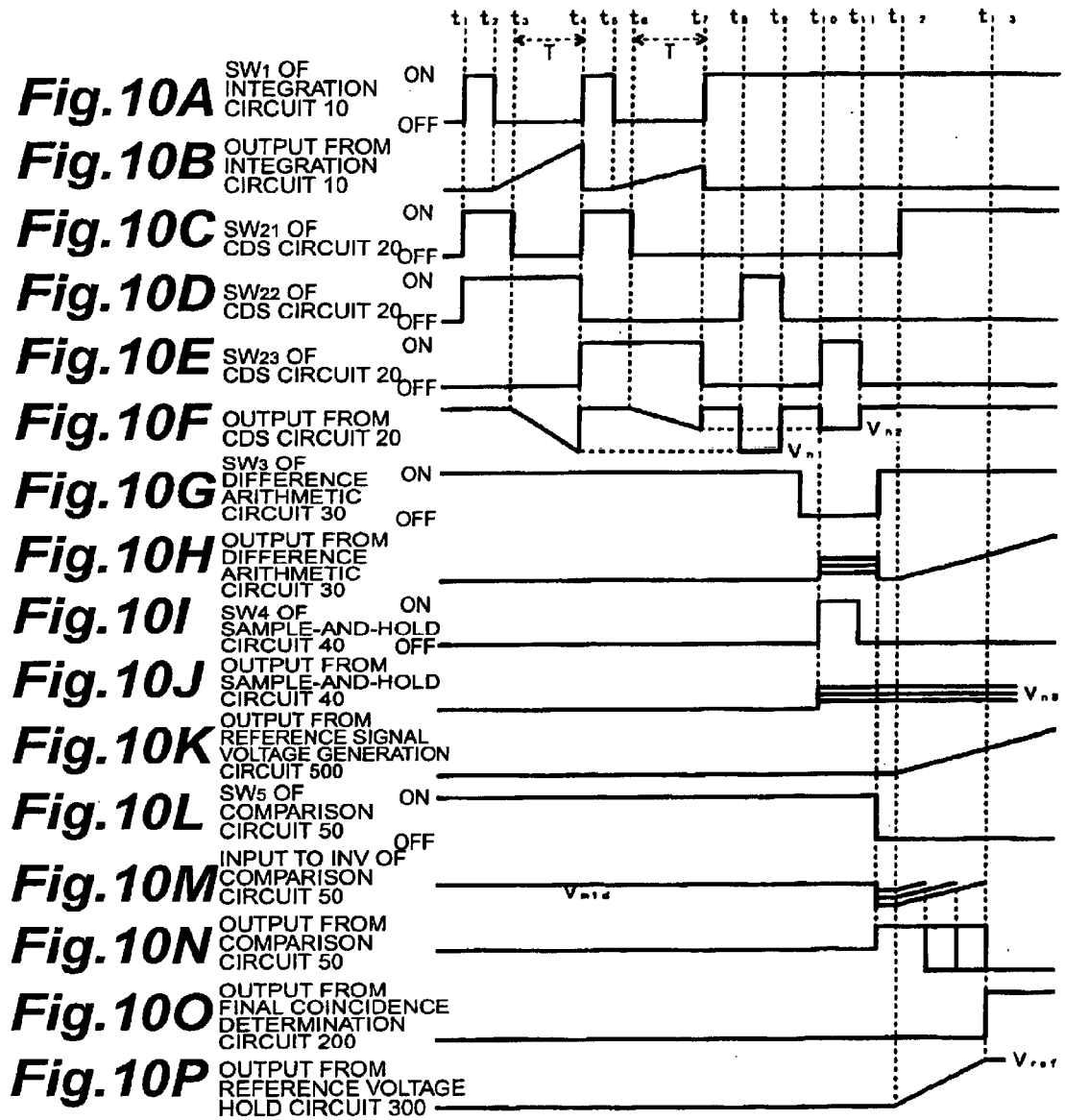

SOLID-STATE IMAGING DEVICE AND DISTANCE MEASURING DEVICE

RELATED APPLICATION

This is a continuation-in-part application of application serial no. PCT/JP00/05284 filed on Aug. 7, 2000, now pending.

BACKGROUND OF THE INVENTION

1. Field of the Invention

The present invention relates to a solid-state imaging device for removing a background light component of light incident on a photodetector and detecting only a signal light component.

2. Related Background Art

A solid-state imaging device has a plurality of photodetectors in a one- or two-dimensional array, in which a signal current output from each photodetector is integrated by an integration circuit, and a signal voltage as an integration result is output. Some solid-state imaging devices convert (A/D-convert) the signal voltage as an analog signal into a digital signal and output the digital signal. If the signal voltage exceeds a predetermined value in this A/D conversion, the digital signal that is A/D-converted and output on the basis of the signal voltage is saturated at a value corresponding to the predetermined value, and consequently, accurate photodetection cannot be performed. Conventionally, the expected maximum value of the signal voltage or a value more than the expected maximum value is set as the predetermined value, thereby preventing the saturation. Alternatively, the dynamic range is widened using a technique such as logarithmic compression.

A solid-state imaging device is used for a distance measuring device installed in, e.g., a camera. In this distance measuring device, reflected light of spot light projected from a light projecting means such as a light-emitting diode to an object is sensed by each of two solid-state imaging devices, and distance measurement is executed on the basis of the two sensed images. In sensing a spot light component (signal light component), a background light component is also superposed and sensed. Hence, only the background light component is sensed by each of the two solid-state imaging devices when no spot light is projected, and the difference between the two images is calculated to obtain the image of only the spot light component, thereby improving the distance measuring accuracy.

SUMMARY OF THE INVENTION

However, in the integration circuit of a conventional solid-state imaging device, a noise error may occur because no measures are taken against a noise component having a value that varies at every integration operation, such as thermal noise of an amplifier in the integration circuit. When the intensity of light incident on the photodetector, i.e., the value of the signal voltage is small, the S/N ratio of photodetection suffers because of the noise component that changes depending on the integration circuit.

In A/D conversion in the conventional solid-state imaging device, a large value is set as the predetermined value to prevent any saturation. For this reason, when the intensity of light incident on the photodetector, i.e., the value of the signal voltage is small, the resolution of the output digital signal is poor.

As in the case wherein a solid-state imaging device is used for a distance measuring device, when the image of only a spot light component is to be obtained by subtracting the image sensing result of a background light component from the image sensing result of the spot light component and background light component, the following problem arises. That is, when the background light component is larger than the spot light component, the signal voltage obtained when the spot light component superposed with the background light component is incident becomes very large. Therefore, to prevent saturation, a larger value must be set as the predetermined value. Hence, a digital signal output on the basis of the spot light component obtained as a subtraction result is poorer in resolution.

As described above, in the conventional solid-state imaging device, the S/N ratio is low. Additionally, in A/D conversion, the resolution of an output digital signal is poor. The present invention has been made to solve the above problems, and has as its object to provide a solid-state imaging device which has a high S/N ratio, prevents any saturation in A/D conversion even when the incident light intensity is high, and obtains an excellent resolution even when the incident light intensity is low.

A solid-state imaging device according to the present invention is characterized by comprising (1) N (N≧2) photodetectors each of which outputs a signal current corresponding to an incident light intensity, (2) N integration circuits each of which is arranged in correspondence with one of the N photodetectors to integrate charges in correspondence with a signal current output from the photodetector and to output a signal voltage corresponding to an amount of the integrated charges, (3) N CDS (Correlated Double Sampling) circuits each of which is arranged in correspondence with one of the N integration circuits and has a first capacitor and amplifier sequentially inserted between an output terminal and an input terminal for receiving the signal voltage output from the integration circuit, second and third capacitors having the same capacitance value and parallelly inserted between an input and an output of the amplifier, and switch means for selecting one of the second and third capacitors to integrate a charge amount corresponding to an amount of a change in signal voltage, (4) N difference arithmetic circuits each of which is arranged in correspondence with one of the N CDS circuits to obtain a difference between the charge amounts integrated in the second and third capacitors of the CnS circuit and to output a difference signal voltage corresponding to the difference, (5) N sample and hold circuits (S-H circuits) each of which is arranged in correspondence with one of the N difference arithmetic circuits to hold and output the difference signal voltage obtained by the difference arithmetic circuit, (6) a reference signal voltage generation circuit which outputs a reference signal voltage having a monotonically increasing value, (7) N comparison circuits each of which is arranged in correspondence with one of the N difference arithmetic circuits to compare a value of the difference signal voltage obtained by the difference arithmetic circuit with the value of the reference signal voltage output from the reference signal voltage generation circuit and to output a coincidence signal representing a timing when the values coincide, (8) a final coincidence determination circuit which receives coincidence signals output from the N comparison circuits and outputs a final coincidence signal representing a latest of timings represented by the coincidence signals, (9) a reference voltage hold circuit which receives the final coincidence signal output from the final coincidence determination circuit and the reference signal voltage output from the reference signal voltage generation circuit and holds and outputs the value of the reference signal voltage at the timing represented by the final coincidence signal, and (10) an A/D conversion circuit which sets an A/D conversion range on the basis of the value of the reference signal voltage output from the reference voltage hold circuit, sequentially receives the difference signal voltages output from the N S-H circuits, converts each difference signal voltage into a digital signal, and outputs the digital signal.

This solid-state imaging device comprises N units each including a photodetector, integration circuit, CDS circuit, difference arithmetic circuit, S-H circuit, and comparison circuit. In each unit, a signal current corresponding to an incident light intensity is output from the photodetector, and the integration circuit integrates charges in correspondence with the signal current output from the photodetector and outputs a signal voltage corresponding to the amount of integrated charges. In the CDS circuit, the signal voltage output from the integration circuit is input to the first capacitor, and one of the second and third capacitors, which is selected by the switch means, integrates the charge amount corresponding to the amount of the change in input signal voltage. The difference arithmetic circuit obtains the difference between the charge amounts integrated in the second and third capacitors of the CDS circuit and outputs the difference signal voltage corresponding to the difference. This difference signal voltage is held by the S-H circuit. The comparison circuit compares the value of the difference signal voltage obtained by the difference arithmetic circuit with the value of the reference signal voltage which is output from the reference signal voltage generation circuit and has a monotonically increasing value, and outputs the coincidence signal representing the timing when the two values coincide.

The final coincidence determination circuit outputs the final coincidence signal representing the latest of the timings represented by the coincidence signals output from the N comparison circuits. The value of the reference signal voltage at the timing represented by the final coincidence signal is held and output from the reference voltage hold circuit. The held value of the reference signal voltage is the maximum value of difference signal voltages held by the N S-H circuits. The A/D conversion circuit sets the A/D conversion range on the basis of the value of the reference signal voltage output from the reference voltage hold circuit, sequentially receives the difference signal voltages output from the N S-H circuits, converts each difference signal voltage into a digital signal, and outputs the digital signal.

A solid-state imaging device according to the present invention is also characterized in that the solid-state imaging device further comprises a timing control circuit which controls operations of the N integration circuits, the N CDS circuits, the N difference arithmetic circuits, the N S-H circuits, the reference signal voltage generation circuit, the N comparison circuits, the final coincidence determination circuit, the reference voltage hold circuit, and the A/D conversion circuit, and is used together with light projecting means for projecting spot light to an object, the timing control circuit causing, (1) during a first period in which the spot light is being projected to the object by the light projecting means, the second capacitor of the CDS circuit to integrate the charge amount corresponding to the amount of the change in signal voltage output from the integration circuit when the spot light component and background light component become incident on the photodetector, (2) during a second period in which the spot light is not projected to the object by the light projecting means, the third capacitor of the CDS circuit to integrate the charge amount corresponding to the amount of the change in signal voltage output from the integration circuit when the background light component becomes incident on the photodetector, (3) during a third period after the first and second periods, the difference arithmetic circuit to calculate the difference between the charge amounts integrated in the second and third capacitors of the CDS circuit and to output the difference signal voltage corresponding to the difference, and the S-H circuit to hold the difference signal voltage, (4) during a fourth period after the third period, the reference signal voltage generation circuit to output the reference signal voltage having the monotonically increasing value, the comparison circuit to output, on the basis of comparison between the values of the difference signal voltage and reference signal voltage, the coincidence signal representing the timing when the values coincide, the final coincidence determination circuit to output the final coincidence signal representing the latest of the timings represented by the coincidence signals, the reference voltage hold circuit to hold the value of the reference signal voltage at the timing represented by the final coincidence signal, and the A/D conversion circuit to set the A/D conversion range on the basis of the held value of the reference signal voltage, and (5) during a fifth period after the fourth period, the A/D conversion circuit to sequentially receive the difference signal voltages output from the N S-H circuits, convert each difference signal voltage into a digital signal, and output the digital signal.

In this case, under the control by the timing control circuit, during the first period, the first charge amount corresponding to the amount of the change in signal voltage output from the integration circuit when the spot light component and background light component become incident on the photodetector is integrated in the second capacitor of the CDS circuit. During the second period, the second charge amount corresponding to the amount of the change in signal voltage output from the integration circuit when the background light component becomes incident on the photodetector is integrated in the third capacitor of the CDS circuit. Either the first or second period can be set first. During the third period after the first and second periods, the difference between the charge amounts integrated in the second and third capacitors of the CDS circuit is obtained by the difference arithmetic circuit, and the difference signal voltage corresponding to the difference is output from the difference arithmetic circuit and held by the S-H circuit. The difference signal voltage held by the S-H circuit corresponds to the spot light component.

Subsequently, during the fourth period, the reference signal voltage having the monotonically increasing value is output from the reference signal voltage generation circuit. On the basis of comparison between the values of the difference signal voltage and reference signal voltage, the comparison circuit outputs the coincidence signal representing the timing when the two values coincide. The final coincidence determination circuit outputs the final coincidence signal representing the latest of timings represented by the coincidence signals. The reference voltage hold circuit holds the value of the reference signal voltage at the timing represented by the final coincidence signal. On the basis of the held value of the reference signal voltage, the A/D conversion range of the A/D conversion circuit is set. During the fifth period after the fourth period, the difference signal voltages output from the N S-H circuits are sequentially input to the A/D conversion circuit, each difference signal voltage is converted into a digital signal, and the digital signal is output from the A/D conversion circuit.

In other words, the above solid-state imaging device is characterized in that, in a solid-state imaging device having an A/D conversion circuit to which output signals from a plurality of circuit arrays are sequentially input, each of the circuit arrays comprises a photodetector, and a comparison circuit which receives a signal (output signal from a difference arithmetic circuit) corresponding to an output from the photodetector and a monotonically increasing voltage (output from a reference signal voltage generation circuit), and outputs a coincidence signal representing a timing when the signal and voltage coincide, the solid-state imaging device comprises a final coincidence determination circuit which receives a plurality of coincidence signals output from the comparison circuits and outputs a final coincidence signal representing a latest of timings represented by the coincidence signals, and an A/D conversion range of the A/D conversion circuit is set in accordance with a value of the monotonically increasing voltage (output from the reference signal voltage generation circuit 500) when the final coincidence signal is output.

The final coincidence signal corresponds to a signal for the highest incident light intensity in signals corresponding to the outputs from the photodetectors PD. Hence, when the A/D conversion range is set on the basis of the final coincidence signal, any saturation can be prevented even when the incident light intensity is high, and an excellent resolution can be obtained even when the incident light intensity is low.

BRIEF DESCRIPTION OF DRAWINGS

FIGS. 10A, 10B, 10C, 10D, 10E, 10F, 10G, 10H, 10I, 10J, 10K, 10L, 10M, 10N, 10O, and 10P are timing charts for explaining the operation of the solid-state imaging device according to the embodiment;

DESCRIPTION OF THE PREFERRED EMBODIMENTS

Figure 1:
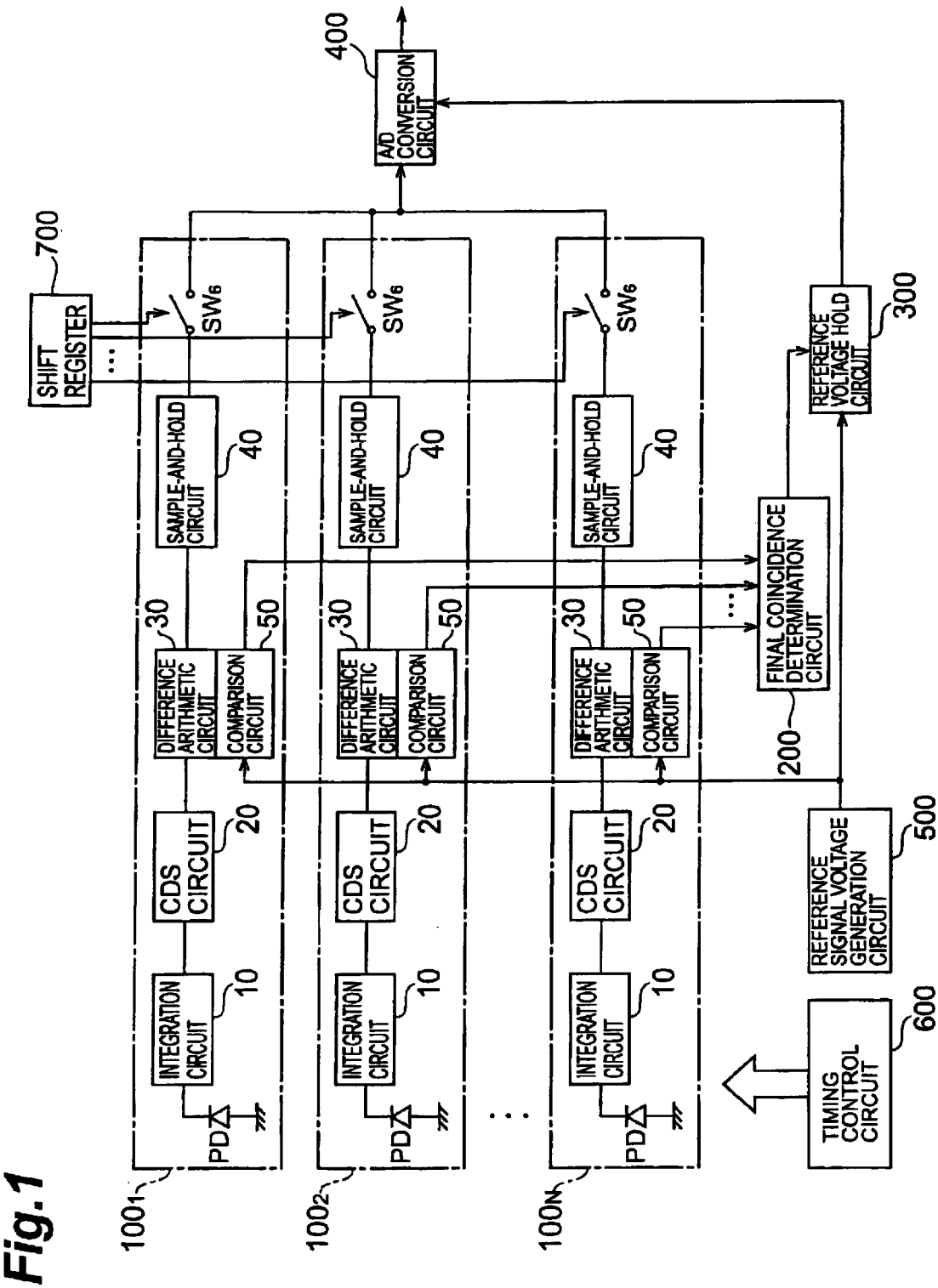
FIG. 1 is a schematic view of the overall arrangement of a solid-state imaging device according to the embodiment.

The embodiments of the present invention will be described below in detail with reference to the accompanying drawings. The same reference numerals denote the same elements throughout the drawings, and a repetitive description will be omitted. In addition, N is an integer of 2 or more, and a suffix n is an integer from 1 to N unless otherwise specified.

(First Embodiment)

The arrangement of a solid-state imaging device according to the first embodiment will be described first with reference to FIGS. 1 to 9. FIG. 1 is a schematic view of the overall arrangement of the solid-state imaging device according to the embodiment. The solid-state imaging device according to this embodiment comprises N units $100_1$ to $100_N$, a final coincidence determination circuit 200, a reference voltage hold circuit 300, an A/D conversion circuit 400, a reference signal voltage generation circuit 500, a timing control circuit 600, and a shift register 700.

Each unit $100_n$ includes a photodiode PD, an integration circuit 10, a CDS circuit 20, a difference arithmetic circuit 30, a S-H circuit 40, a comparison circuit 50, and a switch $SW_6$. The integration circuits 10 of the units $100_n$ have identical arrangements. The CDS circuits 20 of the units $100_n$ have identical arrangements. The difference arithmetic circuits 30 of the units $100_n$ have identical arrangements. The S-H circuits 40 of the units $100_n$ have identical arrangements. The comparison circuits 50 of the units $100_n$ have identical arrangements. Hence, the N units $100_1$ to $100_N$ have identical arrangements.

The photodiode PD of each unit $100_n$ has an anode terminal grounded and a cathode terminal connected to the input terminal of the integration circuit 10. The photodiode PD outputs a signal current corresponding to an incident light intensity from the cathode terminal to the input terminal of the integration circuit 10.

The photodiodes PD of the units $100_n$ are in a one- or two-dimensional array to image a one- or two-dimensional object. The number of photodiodes PD is N, and the N photodetectors form an array.

Figure 2:
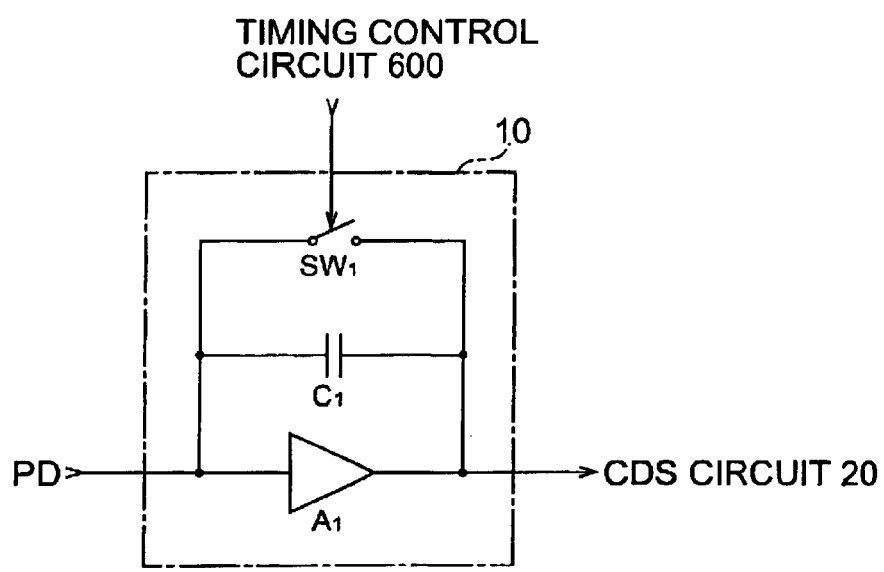
FIG. 2 is a circuit diagram of the integration circuit of the solid-state imaging device according to the embodiment.

FIG. 2 is a circuit diagram of the integration circuit 10 of the solid-state imaging device according to the embodiment. In the integration circuit 10 of each unit $100_n$, an amplifier $A_1$, capacitor $C_1$, and switch $SW_1$ are connected in parallel between the input terminal and the output terminal. When the switch $SW_1$ is ON, the integration circuit 10 discharges the capacitor $C_1$ to initialize it. On the other hand, when the switch $SW_1$ is OFF, the integration circuit 10 integrates charges input from the photodiode PD to the input terminal in the capacitor $C_1$ and outputs a signal voltage corresponding to the integrated charges from the output terminal. The switch $SW_1$ is turned on/off on the basis of a control signal output from the timing control circuit 600.

Figure 3:
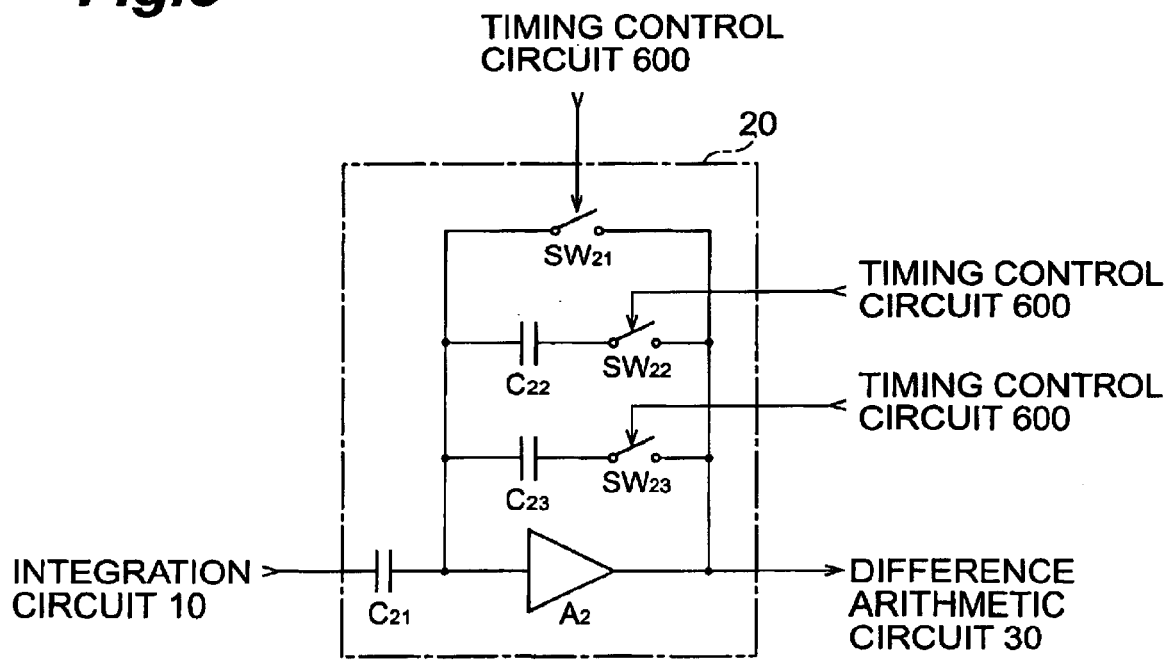
FIG. 3 is a circuit diagram of the CDS circuit of the solid-state imaging device according to the embodiment.

FIG. 3 is a circuit diagram of the CDS circuit 20 of the solid-state imaging device according to the embodiment. The CDS circuit 20 of each unit $100_n$ has a first capacitor $C_{21}$ and amplifier $A_2$ sequentially between the input terminal and the output terminal. In addition, a switch $SW_{21}$, a second capacitor $C_{22}$ and switch $SW_{22}$ which are serial-connected to each other, and a third capacitor $C_{23}$ and switch $SW_{23}$ which are serial-connected to each other are parallelly connected between the input and the output of the amplifier $A_2$. The capacitances of the capacitors $C_{22}$ and $C_{23}$ are equal.

When the switches $SW_{21}$ to $SW_{23}$ are ON, the CDS circuit 20 discharges the capacitors $C_{22}$ and $C_{23}$ to initialize them. When the switches $SW_{21}$ and $SW_{23}$ are OFF, and the switch $SW_{22}$ is ON, first charges input from the integration circuit 10 through the capacitor $C_{21}$ are integrated in the capacitor $C_{22}$, and a signal voltage corresponding to the integrated charges is output from the output terminal. When the switches $SW_{21}$ and $SW_{22}$ are OFF, and the switch $SW_{23}$ is ON, second charges input from the integration circuit 10 through the capacitor $C_{21}$ are integrated in the capacitor $C_{23}$, and a signal voltage corresponding to the integrated charges is output from the output terminal. The switches $SW_{21}$, $SW_{22}$ and $SW_{23}$ are turned on/off on the basis of a control signal output from the Liming control circuit 600.

Figure 4:
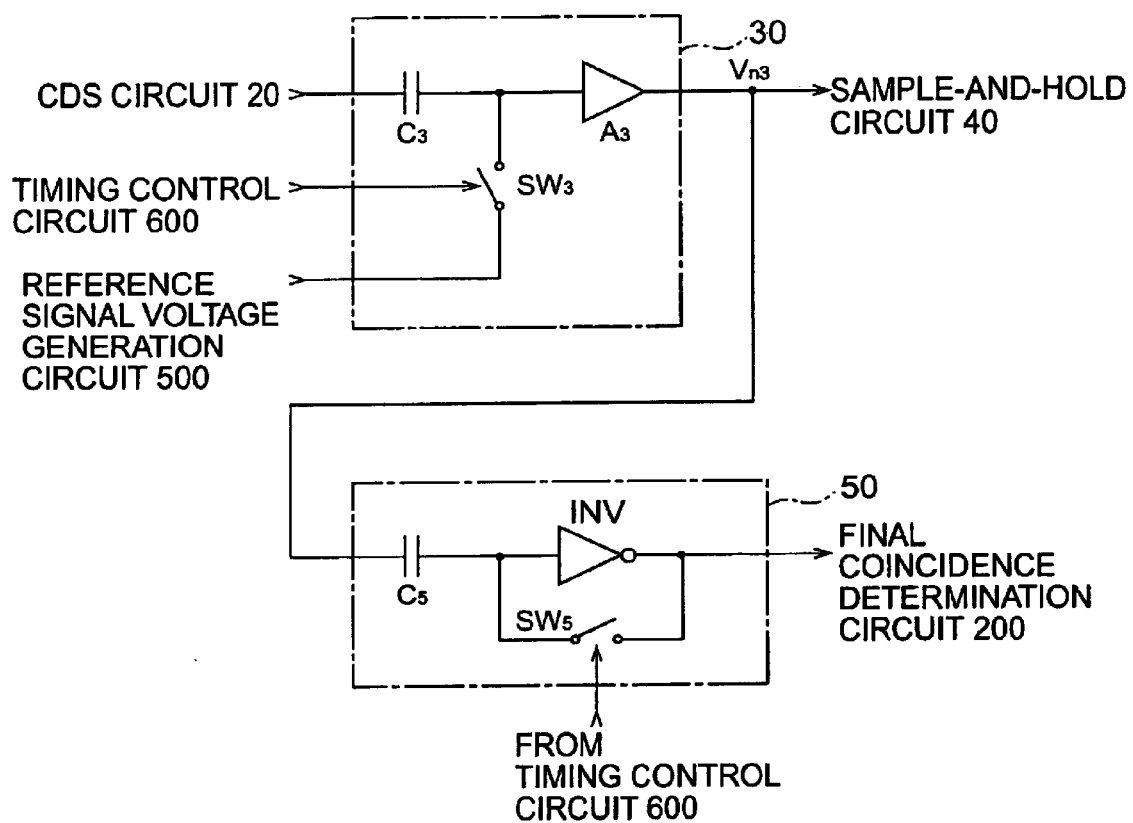
FIG. 4 is a circuit diagram of the difference arithmetic circuit and comparison circuit of the solid-state imaging device according to the first embodiment.

FIG. 4 is a circuit diagram of the difference arithmetic circuit 30 and comparison circuit 50 of the solid-state imaging device according to the first embodiment. The difference arithmetic circuit 30 of each unit $100_n$ has a capacitor $C_3$ and amplifier A sequentially between the input terminal and the output terminal. The connection point between the capacitor $C_3$ and the amplifier $A_3$ is connected to the reference signal voltage generation circuit 500 through a switch $SW_3$. When the reference signal voltage input from the reference signal voltage generation circuit 500 to the switch $SW_3$ has a predetermined potential (e.g., the ground potential), and the switch $SW_3$ is ON, the difference arithmetic circuit 30 stores only charges Q1 in the capacitor $C_3$. When the switch $SW_3$ is OFF, the difference arithmetic circuit 30 removes charges Q2 from the capacitor $C_3$. With this operation, the difference arithmetic circuit 30 integrates the difference between the charges Q1 and Q2 input from the CDS circuit 20, i.e., charges (Q1−Q2) in the capacitor $C_3$ and outputs a difference signal voltage $V_{n3}$ corresponding to the integrated charges (Q1−Q2) from the amplifier $A_3$. When the switch $SW_3$ is ON, the difference arithmetic circuit 30 inputs to the amplifier A the reference signal voltage which is input from the reference signal voltage generation circuit 500 to the switch $SW_3$ and has a monotonically increasing value. The switch $SW_3$ is turned on/off on the basis of a control signal output from the timing control circuit 600.

The comparison circuit 50 of each unit $100_n$ has a capacitor $C_5$ and inverter INV sequentially between the input terminal and the output terminal. A switch $SW_5$ is connected between the input and the output of the inverter INV. The switch $SW_5$ is turned on/off on the basis of a control signal output from the timing control circuit 600. When the switch $SW_5$ is ON, the comparison circuit 50 outputs an intermediate potential (the intermediate value between the power supply potential and the ground potential) $V_{mid}$ from the inverter INV, and a voltage $V_{n1}$ is held on one side of the capacitor $C_5$. At this time, a value $V_{n2}$ of a signal voltage output from the difference arithmetic circuit 30 is held at the terminal on the opposite side of the capacitor $C_5$. As a result, a charge amount obtained by multiplying the difference potential between the voltages values $V_{n1}$ and $V_{n2}$ by the capacitance value of the capacitor $C_5$ is held by the capacitor $C_5$.

After that, when the switch $SW_3$ of the difference arithmetic circuit 30 is turned on, the potential $V_{n2}$ on one side of the capacitor $C_5$ abruptly drops to the reference potential level at this time. Simultaneously, when the switch $SW_5$ of the comparison circuit 50 is also turned off, the voltage value $V_{n1}$ also varies in the same amount as that of the variation in voltage value $V_{n2}$ and abruptly drops. When the reference signal voltage from the reference signal voltage generation circuit 500 monotonically increases, the voltage values $V_{n1}$ and $V_{n2}$ also slowly rise in proportion to the reference signal voltage. When the voltage value $V_{n1}$ reaches the intermediate potential $V_{mid}$, the output from the inverter INV is abruptly inverted. With this function, the magnitude of the output voltage value from the difference arithmetic circuit 30 is compared with the reference voltage. Note that the reference signal voltage generation circuit 500 generates a saw tooth wave having a voltage that changes as a function of time.

As described above, the comparison circuit 50 compares the value of the reference signal voltage output from the reference signal voltage generation circuit 500 and received through the amplifier $A_3$ of the difference arithmetic circuit 30 with the voltage value held by the capacitor $C_5$, and outputs a logic signal representing the comparison result. The logic signal (coincidence signal) output from the comparison circuit 50 is inverted at a timing when the value of the reference signal voltage coincides the voltage value held by the capacitor $C_5$.

Figure 5:
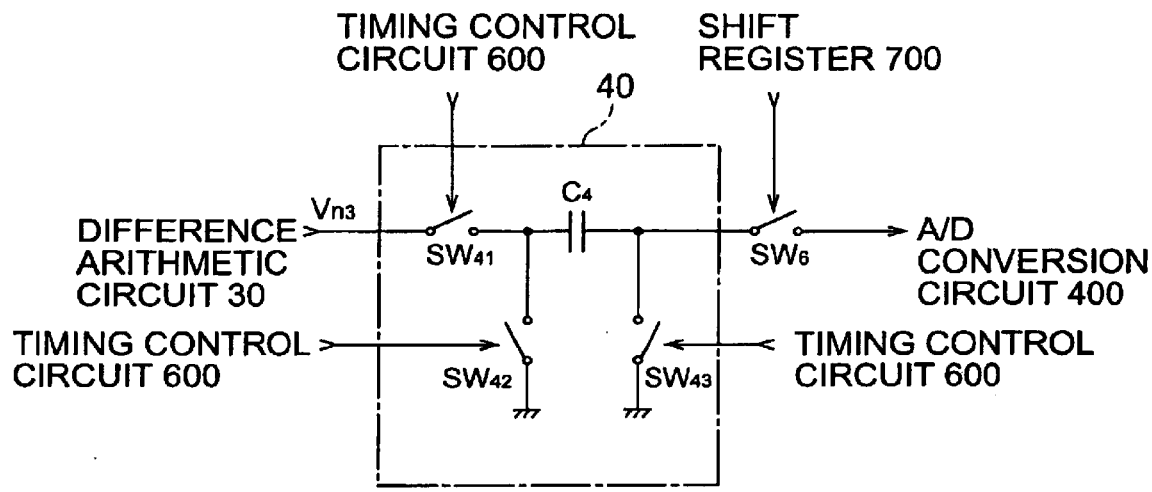
FIG. 5 is a circuit diagram of the S-H circuit of the solid-state imaging device according to the embodiment.

FIG. 5 is a circuit diagram of the S-H circuit 40 of the solid-state imaging device according to the embodiment. The S-H circuit 40 of each unit $100_n$ has a switch $SW_{41}$ and capacitor $C_4$ sequentially between the input terminal and the output terminal. The connection point between the switch $SW_{41}$ and the capacitor $C_4$ is grounded through a switch $SW_{42}$, and the point between the capacitor $C_4$ and the output terminal is grounded through a switch $SW_{43}$. When the switches $SW_{41}$ and $SW_{43}$ are ON, the S-H circuit 40 stores the difference signal voltage $V_{n3}$ output from the difference arithmetic circuit 30 in the capacitor $C_4$, and even after the switch $SW_{41}$ is turned off, holds the signal voltage $V_{n3}$ in the capacitor $C_4$. The switches $SW_{41}$ to $SW_{41}$ are turned on/off on the basis of a control signal output from the timing control circuit 600. The switches $SW_6$ of the respective units $100_n$ are sequentially turned on under the control of the shift register 700. When the switches $SW_{42}$ are also turned on, pieces of information of the difference signal voltages $V_{n3}$ output from the S-H circuits 40 are sequentially input to the A/D conversion circuit 400 in the form of charges in accordance with the same principle as a switched capacitor.

Figure 6:
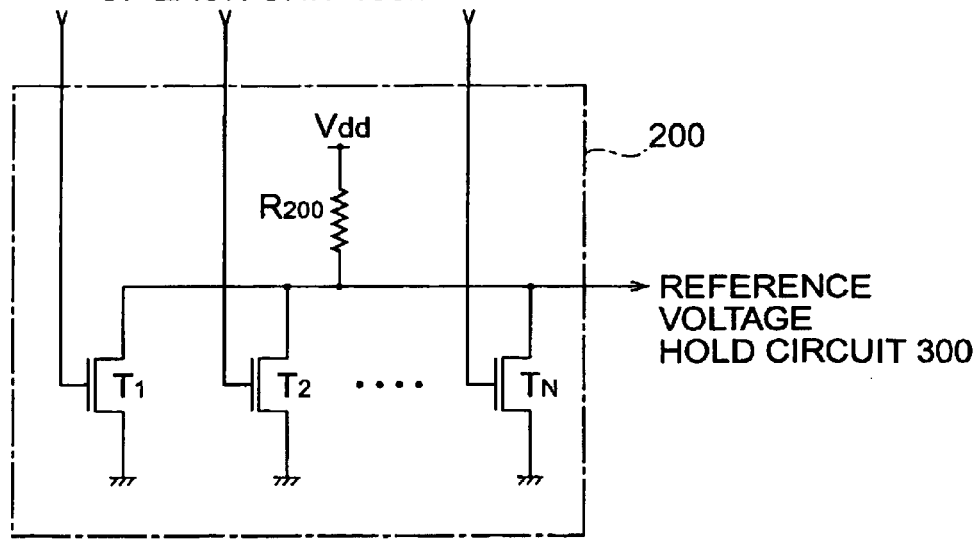
FIG. 6 is a circuit diagram of the final coincidence determination circuit of the solid-state imaging device according to the embodiment.

FIG. 6 is a circuit diagram of the final coincidence determination circuit 200 of the solid-state imaging device according to the embodiment. The final coincidence determination circuit 200 has NMOS transistors $T_1$ to $T_N$ and a resistor $R_{200}$. The source terminals of the respective transistors $T_n$ are grounded, and the drain terminals of the respective transistors $T_n$ are commonly connected to a power supply voltage Vdd through the resistor $R_{200}$. The gate terminal of each transistor $T_n$ is connected to the output terminal of the comparison circuit 50 of a corresponding unit $100_n$ to receive the logic signal output from the comparison circuit 50. In this final coincidence determination circuit 200, the logic signal (coincidence signal) output from the comparison circuit 50 of each unit $100_n$ is input to the gate terminal of a corresponding transistor $T_n$. When all the logic signals change to logic L, a logic signal of logic H is output from the output terminal to the reference voltage hold circuit 300. The logic of the logic signal (final coincidence signal) output from the final coincidence determination circuit 200 is inverted at the latest of timings when the logic of the logic signals (coincidence signals) from the comparison circuits 50 of the respective units $100_n$ is inverted. The final coincidence determination circuit 200 having the above arrangement is preferable because the circuit size is small. Note that the final coincidence determination circuit 200 may be an N-input NOR logic circuit. This circuit is preferable because an accurate logic level value can be output, an operation error hardly occurs, and the power consumption is low.

Figure 7:
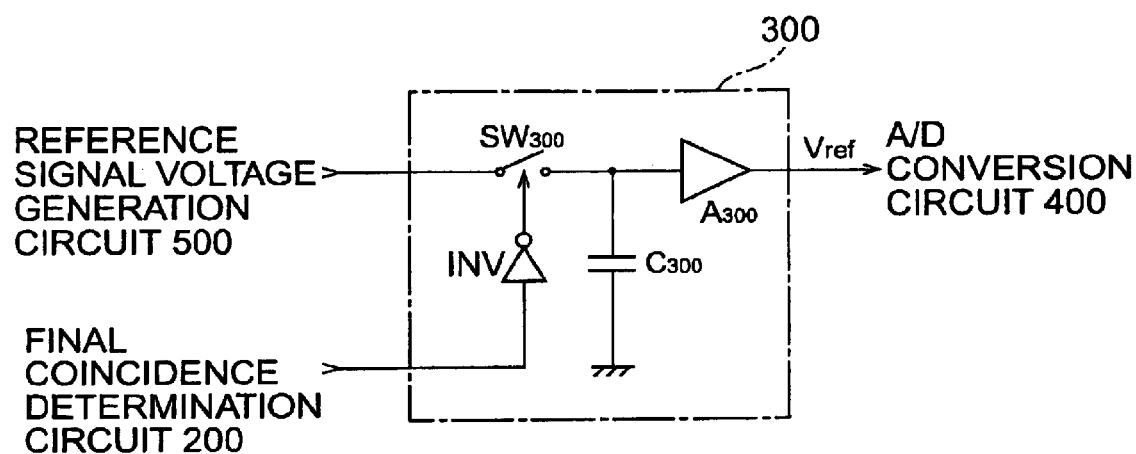
FIG. 7 is a circuit diagram of the reference voltage hold circuit of the solid-state imaging device according to the embodiment.

FIG. 7 is a circuit diagram of the reference voltage hold circuit 300 of the solid-state imaging device according to the embodiment. The reference voltage hold circuit 300 has a switch $SW_{300}$ and amplifier $A_{300}$ sequentially between the input terminal and the output terminal. The connection point between the switch $SW_{300}$ and the amplifier $A_{300}$ is grounded through a capacitor $C_{300}$. When the logic signal (final coincidence signal) output from the final coincidence determination circuit 200 changes to logic H, the reference voltage hold circuit 300 turns off the switch $SW_{300}$ to hold in the capacitor $C_{300}$ the value of the reference signal voltage output from the reference signal voltage generation circuit 500 at that time and outputs the value from the amplifier $A_{300}$.

Figure 8:
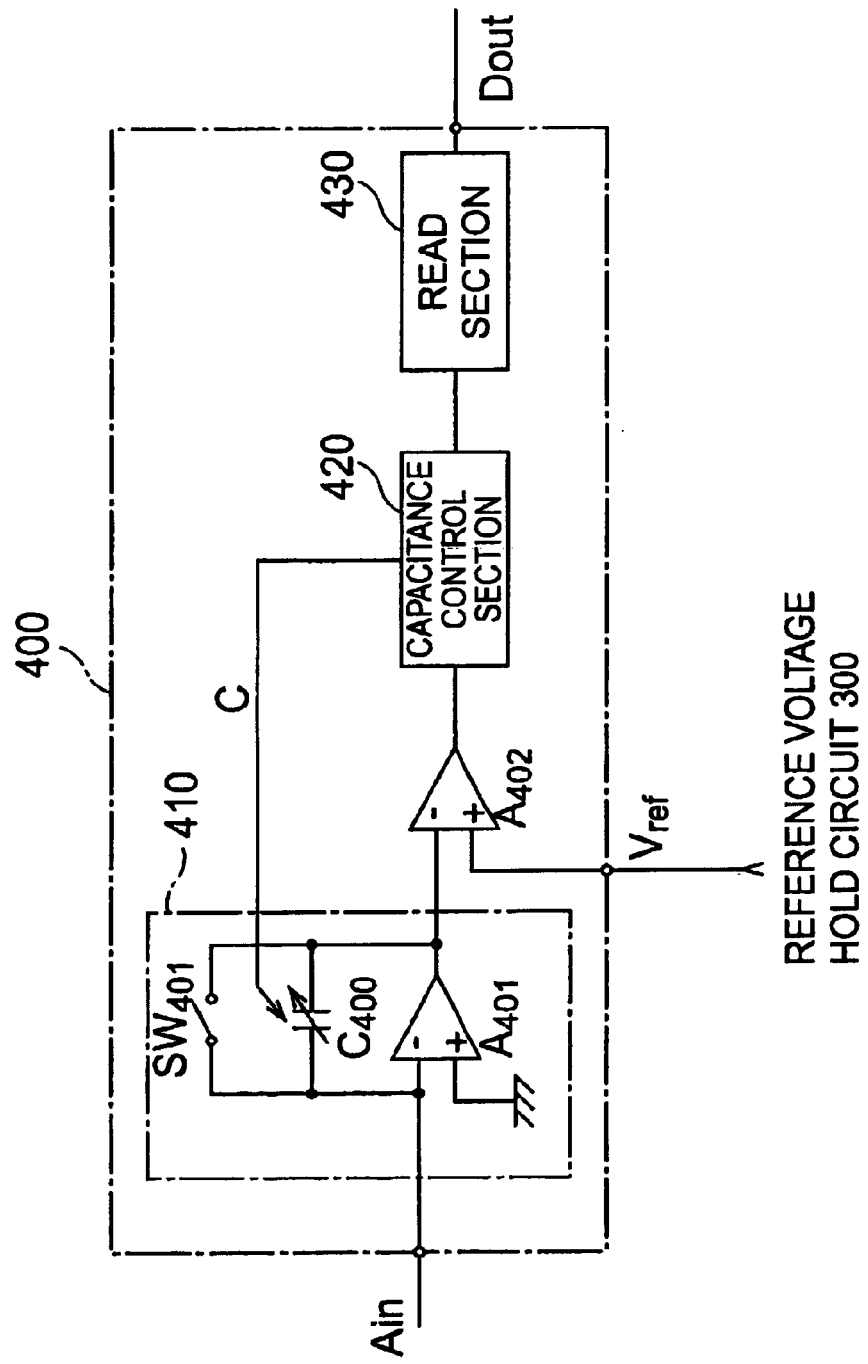
FIG. 8 is a circuit diagram of the A/D conversion circuit of the solid-state imaging device according to the embodiment.

FIG. 8 is a circuit diagram of the AID conversion circuit 400 of the solid-state imaging device according to the embodiment. The A/D conversion circuit 400 receives the reference voltage value information output from the reference voltage hold circuit 300 in the form of charges and uses the reference voltage value as an A/D conversion range. The A/D conversion circuit 400 sequentially receives the difference signal voltages $V_{n3}$ output from the S-H circuits 40 or the respective units 100$_n$ through the switches $SW_6$, converts each signal voltage (analog signal) into a digital signal, and outputs the digital signal. The A/D conversion circuit 400 comprises a variable capacitance integration circuit 410, a comparison circuit $A_{402}$, a capacitance control section 420, and a read section 430.

The variable capacitance integration circuit 410 comprises an amplifier $A_{401}$, a variable capacitance section $C_{400}$, and a switch $SW_{401}$. The amplifier $A_{401}$ receives at its inverting input terminal a charge amount proportional to each of the difference signal voltages $V_{n3}$ that have been output from the S-H circuits 40 of the respective units 100$_n$ and sequentially arrived through the switches $SW_5$. The non-inverting input terminal of the amplifier $A_{401}$ is grounded. The capacitance of the variable capacitance section $C_{400}$ is variable and controllable. The variable capacitance section $C_{400}$ is inserted between the inverting input terminal and the output terminal of the amplifier $A_{401}$ to integrate charges in accordance with the received signal voltage The switch $SW_{401}$ is inserted between the inverting input terminal and the output terminal of the amplifier $A_{401}$. When the switch $SW_{401}$ is OFF, the variable capacitance section $C_{400}$ integrates charges. When the switch $SW_{401}$ is ON, charge accumulation in the variable capacitance section $C_{400}$ is reset. The variable capacitance integration circuit 410 sequentially receives the signal voltages output from the respective units 100$_n$, integrates them in accordance with the capacitance of the variable capacitance section $C_{400}$, and outputs an integration signal as an integration result.

The comparison circuit $A_{402}$ receives the integration signal output from the variable capacitance integration circuit 410 at its inverting input terminal and the reference voltage value output from the reference voltage hold circuit 300 at its non-inverting input terminal, compares the values of the two input signals, and outputs a comparison result signal as a comparison result.

The capacitance control section 420 receives the comparison result signal output from the comparison circuit $A_{402}$ and outputs a capacitance instruction signal C which controls the capacitance of the variable capacitance section $C_{400}$ on the basis of the comparison result signal. In addition, when it is determined on the basis of the comparison result signal that the value of the integration signal coincides the reference voltage value at a predetermined resolution, the capacitance control section 420 outputs a first digital signal corresponding to the capacitance value of the variable capacitance section $C_{400}$.

The read section 430 receives the first digital signal output from the capacitance control section 420 and outputs a second digital signal corresponding to the first digital signal. The second digital signal indicates a value obtained by removing the offset value of the variable capacitance integration circuit 410 from the value of the first digital signal. The read section 430 is, e.g., a memory element which receives the first digital signal as an address and outputs data stored at that address of the memory element as the second digital signal. The second digital signal is the photodetection signal output from the solid-state imaging device according to this embodiment.

Figure 9:
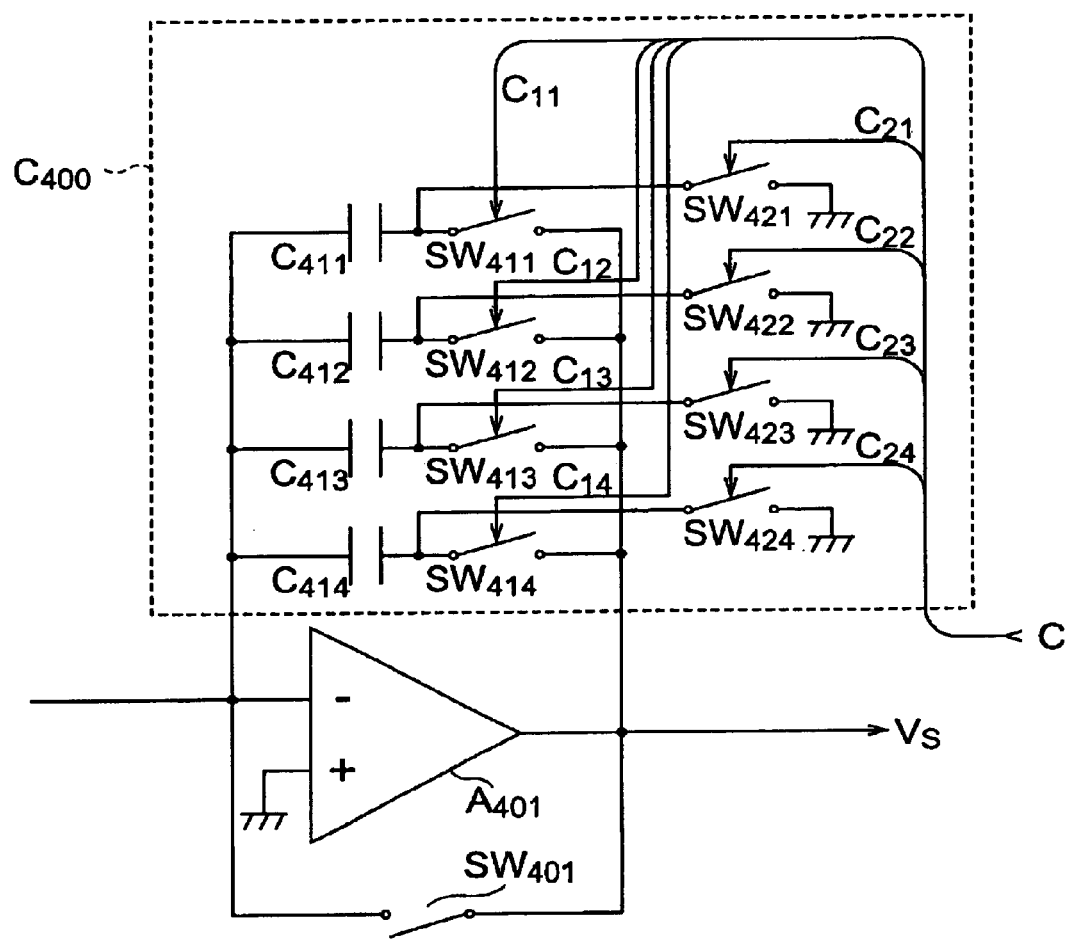
FIG. 9 is a detailed circuit diagram of the variable capacitance integration circuit in the A/D conversion circuit.

FIG. 9 is a detailed circuit diagram of the variable capacitance integration circuit 410 in the A/D conversion circuit 400. FIG. 9 shows a circuit arrangement having an A/D conversion function with a resolution of $\frac{1}{2^4}=\frac{1}{16}$. A description will be done below on the basis of this circuit arrangement.

As shown in FIG. 9, the variable capacitance section $C_{400}$ comprises capacitors $C_{411}$ to $C_{414}$, switches $SW_{411}$ to $SW_{414}$, and switches $SW_{421}$ to $SW_{424}$. The capacitor $C_{411}$ and switch $SW_{411}$ are serial-connected to each other and inserted between the inverting input terminal and the output terminal of the amplifier $A_{401}$. The switch $SW_{421}$ is inserted between the ground potential and the connection point between the capacitor $C_{411}$ and the switch $SW_{411}$. The capacitor $C_{412}$ and switch $SW_{412}$ are serial-connected to each other and inserted between the inverting input terminal and the output terminal of the amplifier $A_{401}$. The switch $SW_{422}$ is inserted between the ground potential and the connection point between the capacitor $C_{412}$ and the switch $SW_{412}$. The capacitor $C_{413}$ and switch $SW_{413}$ are serial-connected to each other and inserted between the inverting input terminal and the output terminal of the amplifier $A_{401}$. The switch $SW_{423}$ is inserted between the ground potential and the connection point between the capacitor $C_{413}$ and the switch $SW_{413}$. The capacitor $C_{414}$ and switch $SW_{414}$ are serial-connected to each other and inserted between the inverting input terminal and the output terminal of the amplifier $A_{401}$The switch $SW_{424}$ is inserted between the ground potential and the connection point between the capacitor $C_{414}$ and the switch $SW_{414}$, The switches $SW_{411}$ to $SW_{414}$ are turned on/off on the basis of signal components C11 to C14 of the capacitance instruction signal C output from the capacitance control section 420, respectively. The switches $SW_{421}$ to $SW_{424}$ are turned on/off on the basis of signal components C21 to C24 of the capacitance instruction signal C output from the capacitance control section 420, respectively. When the capacitance values of the capacitors $C_{411}$ to $C_{414}$ are represented by $C_{411}$ to $C_{414}$, they satisfy $$C_{411}=2C_{412}=4C_{413}=8C_{414} \qquad (1)$$

$$C_{411}+C_{412}+C_{413}+C_{414}=C_0 \qquad (2)$$

The reference signal voltage generation circuit 500 generates the reference signal voltage and supplies it to the comparison circuit 50 of each unit 100$_n$ and also supplies it to the reference voltage hold circuit 300. In this embodiment, the reference signal voltage is supplied to the comparison circuit 50 indirectly through the amplifier $A_3$ of the difference arithmetic circuit 30. The reference signal voltage has a predetermined potential (e.g., the ground potential) until the difference arithmetic circuit 30 executes the difference arithmetic operation and the S-H circuit 40 holds the result. After that, the voltage value monotonically increases. The shift register 700 sequentially turns on the switches $SW_6$ of the respective units $100_n$ after the monotonical increase in reference signal voltage is ended. The timing control circuit 600 ON/OFF-controls the remaining switches and controls the reference signal voltage output from the reference signal voltage generation circuit 500.

The operation of the solid-state imaging device according to this embodiment will be described next. FIGS. 10A, 10B, 10C, 10D, 10E, 10F, 10G, 10H, 10I, 10J, 10K, 10L, 10M, 10N, 10O, and 10P are timing charts for explaining the operation of the solid-state imaging device according to the embodiment. A case wherein the solid-state imaging device according to this embodiment constructs a distance measuring device together with a light projecting means LED (FIG. 14) such as a light-emitting diode will be described below. That is, in the operation to be described below, a background light component is removed, and a photodetection signal for only a spot light component (signal light component) projected from the light-emitting diode to an object is output.

At time $t_1$, the switch $SW_1$ of the integration circuit 10 is turned on to discharge and initialize the capacitor $C_1$. In addition, the switch $SW_{21}$ of the CDS circuit 20 is turned on to stop CDS operation in the CDS circuit 20. At time $t_2$, the switch $SW_1$ of the integration circuit 10 is turned off. From the time $t_2$, charges output from the photodiode PD are integrated in the capacitor $C_1$, and the signal voltage output from the output terminal of the integration circuit 10 gradually becomes high. At this time $t_2$, the switch $SW_{21}$ of the CDS circuit 20 remains ON. Simultaneously, the switch $SW_{22}$ is turned on to remove residual charges from the capacitor $C_{22}$. The switch $SW_{23}$ is OFF. At time $t_3$, the switch $SW_{21}$ of the CDS circuit 20 is turned off, and the switch $SW_{22}$ remains ON. At time $t_4$ after the elapse of a predetermined time T from the time $t_3$, the switch $SW_{21}$ of the CDS circuit 20 is turned on, and the switch $SW_{22}$ is turned off.

During the period from the times $t_2$ to $t_4$, spot light is projected from the light-emitting diode to the object. Hence, both the spot light component and the background light component projected from the light-emitting diode and reflected by the object become incident on the photodiode PD, and a signal current generated by the components is output from the photodiode PD. Upon receiving the signal current, the integration circuit 10 integrates charges in the capacitor $C_1$ and outputs a signal voltage corresponding to the amount of integrated charges. During the period from the times $t_3$ to $t_4$ (first period), the signal voltage output from the output terminal of the integration circuit 10 is input to the CDS circuit 20, charges corresponding to the amount of a change in input signal voltage from the time $t_3$ are integrated in the capacitor $C_{22}$, and a signal voltage corresponding to the amount of integrated charges is output from the CDS circuit 20. Hence, the signal voltage output from the CDS circuit 20 at the time $t_4$ has the voltage value $V_{n1}$ corresponding to the difference between the signal voltages output from the integration circuit 10 at the times $t_3$ and $t_4$ so that the noise component generated in the integration circuit 10 is removed.

At the time $t_a$, the switch $SW_{22}$ is turned off, and a charge in the capacitor C22 is held as the CDS result at that time. Immediately after that, the switch $SW_1$ of the integration circuit 10 is turned on to discharge and initialize the capacitor $C_1$. In addition, the switch $SW_{21}$ of the CDS circuit 20 is turned on to stop CDS operation in the CDS circuit 20. Simultaneously, the switch $SW_{23}$ is turned on to remove residual charges from the capacitor $C_{23}$. At time $t_5$, the switch $SW_1$ of the integration circuit 10 is turned off. From the time $t_5$, charges output from the photodiode PD are integrated in the capacitor $C_1$ and the signal voltage output from the output terminal of the integration circuit 10 gradually becomes high. At this time $t_5$ the switch $SW_{21}$ of the CDS circuit 20 remains ON, and the switch $SW_{22}$ is OFF, At time $t_6$, the switch $SW_{21}$ of the CDS circuit 20 is turned off, and the switch SW remains ON. At time t, after the elapse of a predetermined time from the time $t_6$, the switch $SW_{23}$ is turned off, and the CDS result at that time is held by the switch $SW_{23}$ in the form of charges. After that, the switch $SW_{21}$ of the CDS circuit 20 is turned on to prepare for the next operation.

During the period from the times $t_5$ to $t_7$, no spot light is projected from the light-emitting diode to the object. Hence, only the background light component becomes incident on the photodiode PD, and a signal current generated by the component is output from the photodiode PD. Upon receiving the signal current, the integration circuit 10 integrates charges in the capacitor $C_1$ and outputs a signal voltage corresponding to the amount of integrated charges. During the period from the times $t_6$ to $t_7$ (second period), the signal voltage output from the output terminal of the integration circuit 10 is input to the CDS circuit 20, charges corresponding to the amount of a change in input signal voltage from the time $t_5$ are integrated in the capacitor $C_{23}$, and a signal voltage corresponding to the amount of integrated charges is output from the CDS circuit 20. Hence, the signal voltage output from the CDS circuit 20 at the time $t_7$ has the voltage value $V_{n2}$ corresponding to the difference between the signal voltages output from the integration circuit 10 at the times $t_6$ and $t_7$ so that the noise component generated in the integration circuit 10 is removed.

From the time $t_7$, the charges integrated in the capacitor $C_{22}$ of the CDS circuit 20 correspond to the sum of the spot light component and background light component, and the charges integrated in the capacitor $C_{23}$ of the CDS circuit 20 correspond to only the background light component. Both the period from the times $t_3$ to $t_4$ (first period) and the period from the times $t_6$ to $t_7$ (second period) equal the time T. Since the capacitance values of the capacitors $C_{22}$ and $C_{23}$ are equal, the voltage value $V_{n1}$ corresponds to the sum of the spot light component and background light component, and the voltage value $V_{n2}$ corresponds to only the background light component. Hence, the voltage difference $V_{n3}=(V_{n1}-V_{n2})$ between them corresponds to only the spot light component. From time $t_8$, the voltage difference $V_{n3}$ is obtained by the difference arithmetic circuit 30 in the following way.

During the period from the times $t_7$ to $t_{11}$ (third period), the switch $SW_1$ of the integration circuit 10 is turned on to discharge the capacitor $C_1$, and the initialized state is maintained. The switch $SW_{21}$ of the CDS circuit 20 remains OFF, During the third period, the difference arithmetic circuit 30 obtains the difference between the charge amounts integrated in the capacitors $C_{22}$ and $C_{23}$ of the CDS circuit 20 and outputs a difference signal voltage corresponding to the difference, and the S-H circuit 40 holds the difference signal voltage output from the difference arithmetic circuit 30.

During the period from the times $t_8$ to $t_9$, the switch $SW_{22}$ of the CDS circuit 20 is turned on. At this time, the switch $SW_3$ of the difference arithmetic circuit 30 is ON. The signal voltage output from the output terminal of the CDS circuit 20 during this period has the voltage value $V_{n1}$ corresponding to the amount of charges integrated in the capacitor $C_{22}$. The voltage value $V_{n1}$ is held by the capacitor $C_3$ of the difference arithmetic circuit 30.

During the period from the times $t_{10}$ to $t_{11}$ the switch $SW_{23}$ of the CDS circuit 20 is turned on. At this time, the switch $SW_3$ of the difference arithmetic circuit 30 is OFF. The signal voltage output from the output terminal of the CDS circuit 20 during this period has the voltage value $V_{n2}$ corresponding to the amount of charges integrated in the capacitor $C_3$. At this time, since the switch $SW_3$ of the difference arithmetic circuit 30 is OFF, the capacitor $C_3$ of the difference arithmetic circuit 30 holds the difference $V_{n3}$ between the voltage value $V_{n2}$ and the voltage value $V_{n1}$. The voltage value $V_{n3}$ is output through the amplifier $A_3$. This voltage value $V_{n3}$ corresponds to only the spot light component.

When the switches $SW_{41}$ and $SW_{43}$ of the S-H circuit 40 are turned on, the voltage value $V_{n3}$ held by the capacitor $C_3$ of the difference arithmetic circuit 30 is held by the capacitor $C_4$ of the S-H circuit 40 through the amplifier $A_3$ of the difference arithmetic circuit 30 and the switch $SW_{41}$ of the S-H circuit 40. Even after the switch $SW_{41}$ is turned off, the voltage value $V_{n3}$ held by the capacitor $C_4$ of the S-H circuit 40 stays held in the form of a charge amount integrated in the capacitor $C_4$.

Until the time $t_{11}$, the switch $SW_5$ of the comparison circuit 50 is ON, and the input and output voltage levels of the inverter INV of the comparison circuit 50 are the intermediate voltage. The value of the difference signal voltage $V_{n3}$ obtained by the difference arithmetic circuit 30 is held by the capacitor $C_5$ of the comparison circuit 50. After the time $t_{11}$, when the switch $SW_3$ of the difference arithmetic circuit 30 is turned on, and the switch $SW_5$ of the comparison circuit 50 is turned off, the output voltage level from the difference arithmetic circuit 30 drops from the voltage value $V_{n3}$ by $-V_{n3}$, and the input voltage level of the inverter INV of the comparison circuit 50 drops from the intermediate voltage by $-V_{n3}$ so that the signal output from the comparison circuit 50 is a logic signal of logic H.

From time $t_{12}$ (fourth period), the value of the reference signal voltage output from the reference signal voltage generation circuit 500 monotonically increases. In the comparison circuit 50 of each unit $100_n$, the voltage value $v_{n3}$ obtained by the difference arithmetic circuit 30 and held by the capacitor $C_5$ is compared with the value of the reference signal voltage output from the reference signal voltage generation circuit 500 and received through the amplifier $A_3$ of the difference arithmetic circuit 30. When the two values coincide, a logic signal (coincidence signal) of logic L is output. The change to logic L in logic signal output from the comparison circuit 50 indicates the timing when the two values coincide.

When all the logic signals output from the comparison circuits 50 of the respective units $100_n$ change to logic L, the final coincidence determination circuit 200 outputs a logic signal (final coincidence signal) of logic H. The change to logic H in logic signal output from the final coincidence determination circuit 200 indicates the latest of timings when the logic signals output from the comparison circuits 50 of the respective units $100_n$ change to logic L. When the logic signal output from the final coincidence determination circuit 200 has changed to logic H, the increase in value of the reference signal voltage output from the reference signal voltage generation circuit 500 may be ended.

In the reference voltage hold circuit 300, when the logic signal output from the final coincidence determination circuit 200 has changed to logic H. the switch $SW_{300}$ is turned off, the value of the reference signal voltage (reference voltage value $V_{ref}$) from the reference signal voltage generation circuit 500 at that timing is held by the capacitor $C_{300}$, and even after that, the reference voltage value $V_{ref}$ is output through the amplifier $A_{300}$. The reference voltage value $V_{ref}$ indicates the maximum value of the difference signal voltages $V_{n3}$ obtained by the difference arithmetic circuits 30 of the respective units $100_n$ and held by the S-H circuits 40. On the basis of the reference voltage value $V_{ref}$ held by the reference voltage hold circuit 300, the A/D conversion range of the A/D conversion circuit 400 is set.

During the period after the A/D conversion range of the A/D conversion circuit 400 is set (fifth period), the switches $SW_6$ of the respective units $100_n$ are sequentially turned on by the shift register 700. When the switch $SW_{401}$ is temporarily turned on to remove all charges from the variable capacitance section $C_{400}$ to reset it, the switch $SW_{401}$ is turned off, and then the switches $SW_6$ and switches $SW_{42}$ are simultaneously turned off, charge amounts proportional to the difference signal voltages $V_{n3}$ output from the S-H circuits 40 of the respective units $100_n$ are transferred to the variable capacitance section $C_{400}$. In this way, voltages corresponding to the difference signal voltages $V_{n3}$ are sequentially input to the variable capacitance section $C400$ of the A/D conversion circuit 400 in the form of charges and converted into digital signals. The digital signals are output from the A/D conversion circuit 400.

The operation of the A/D conversion circuit 400 will be described next with reference to FIGS. 11A, 11B, 11C, and 11D. At time $t_{13}$, the switch $SW_{401}$ of the variable capacitance integration circuit 410 is ON, so that the variable capacitance integration circuit 410 is in the reset state. The switches $SW_{411}$ to $SW_{414}$ of the variable capacitance integration circuit 410 are ON, the switches $SW_{421}$ to $SW_{421}$ are OFF, and the capacitance value of the variable capacitance section $C_{400}$ is set to $C_{11}$.

Figure 11A:
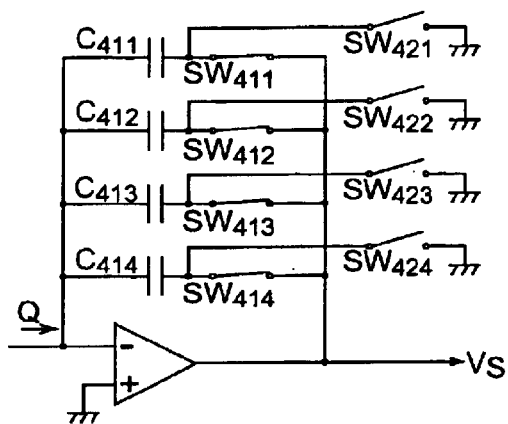
FIGS. 11A, 11B, 11C, and 11D are views for explaining the operation of the A/D conversion circuit.

At certain time from the time $t_{13}$, the switch $SW_{401}$ of the A/D conversion circuit 400 is turned off, and the switch $SW_6$ of the first unit $100_1$ is turned on. When the switches $SW_{41}$ and $SW_{43}$ are turned off, and the switch $SW_{42}$ is turned on, a charge amount Q integrated in the capacitor $C_4$ of the S-H circuit 40 of the unit $100_1$ is input to the variable capacitance integration circuit 410 of the A/D conversion circuit 400 through the switch $SW_6$. When the charge amount Q is input to the variable capacitance integration circuit 410, the charges Q corresponding to the value of a signal voltage $V_{13}$ and the capacitance value $C_{11}$ of the variable capacitance section $C_{400}$ flow into the variable capacitance section $C_{400}$ (FIG. 11A). At this time, a value $V_{sa}$ of the integration signal output from the variable capacitance integration circuit 410 is given by $$V_{sa}=V_{13}=Q/C_0 \quad (3)$$

Figure 11B:
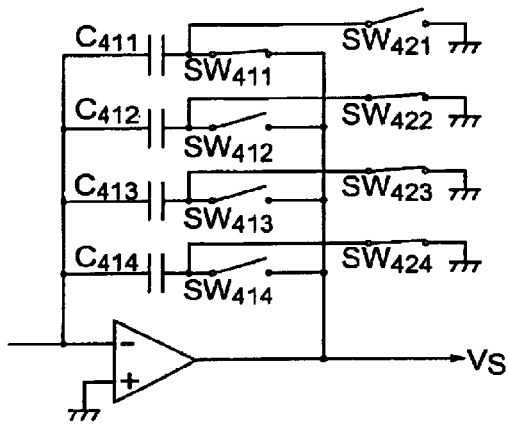

Subsequently, the capacitance control section 420 turns off the switches $SW_{412}$ to $SW_{414}$ of the variable capacitance section $C_{400}$ and then turns on the switches $SW_{422}$ to $SW_{424}$ (FIG. 11B). As a consequence, the capacitance value of the variable capacitance section $C_{400}$ becomes $C_{411}$, and a value $V_{sb}$ of the integration signal output from the variable capacitance integration circuit 410 is given by $$V_{sb}=Q/C_{411} \quad (4)$$

This integration signal is input to the comparison circuit $A_{402}$, and its value is compared with the reference voltage value $V_{ref}$.

Figure 11C:
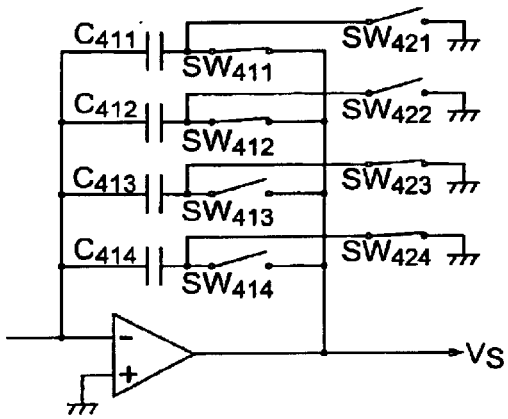

If $V_{sb} > V_{ref}$ upon receiving the comparison result, the capacitance control section 420 also turns off the switch $SW_{422}$ of the variable capacitance section $C_{400}$ and then turns on the switch $SW_{412}$ (FIG. 11C). As a result, the capacitance value of the variable capacitance section $C_{400}$ becomes $C_{411}+C_{412}$, and a value $V_{sb}$ of the integration signal output from the variable capacitance integration circuit 410 is given by $$V_{sb}=Q/(C_{411}+C_{412}) \quad (5)$$

This integration signal is input to the comparison circuit $A_{402}$, and its value is compared with the reference voltage value $V_{ref}$.

Figure 11D:
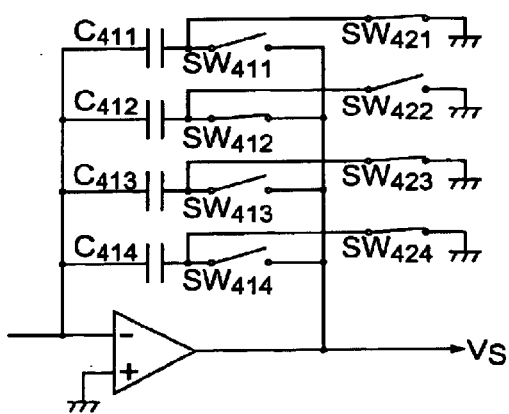

If $V_{sb}<V_{ref}$, upon receiving the comparison result, the capacitance control section 420 also turns off the switches $SW_{411}$ and $SW_{422}$ of the variable capacitance section $C_{400}$ and then turns on the switches $SW_{412}$ and $SW_{421}$ (FIG. 11D). As a result, the capacitance value of the variable capacitance section $C_{400}$ becomes $C_{412}$, and a value $V_{sd}$ of the integration signal output from the variable capacitance integration circuit 410 is given by $$V_{sd}=Q/C_{412} \quad (6)$$

This integration signal is input to the comparison circuit $A_{402}$ and its value is compared with the reference voltage value $V_{ref}$.

In a similar way, until the capacitance control section 420 determines that the value of the integration signal is equal to the reference potential $V_{ref}$ at a predetermined resolution, the feedback loop formed from the variable capacitance integration circuit 410, comparison circuit $A_{402}$, and capacitance control section 420 repeatedly sets the capacitance value of the variable capacitance section $C_{400}$ and compares the value of the integration signal with the reference voltage value $V_{ref}$. When capacitance control for all the capacitors $C_{411}$ to $C_{414}$ of the variable capacitance section $C_{400}$ is ended, the capacitance control section 420 outputs a digital signal corresponding to the final capacitance value of the variable capacitance section $C_{400}$ to the read section 430.

The read section 430 receives the digital signal output from the capacitance control section 420 as an address and outputs digital data stored at the address of the memory as a photodetection signal of the solid-state imaging device according to this embodiment. In the above-described way, the signal voltage $V_{13}$ corresponding to the spot light intensity incident on the photodiode PD of the first unit $100_1$ is converted into a digital signal by the A/D conversion circuit 400, and the digital signal is output as a photodetection signal. In a similar manner, the difference signal voltages $V_{n3}$ corresponding to the spot light intensity incident on the photodiodes PD of the second and subsequent units $100_n$ are converted into digital signals, and the digital signals are sequentially output as photodetection signals.

The maximum value of the signal voltages $V_{n3}$ input to the variable capacitance integration circuit 410 is the reference voltage value $V_{ref}$, and the maximum value of the capacitance values of the variable capacitance section $C_{400}$ is $C_0$. Hence, the maximum value of the amount of charges Q flowing into the variable capacitance section $C_{400}$ is obtained as $V_{ref}\cdot C_0$ from equation (3) When the nth signal voltage $V_{n3}$ has the reference voltage value $V_{ref}$, all the switches $SW_{411}$ to $SW_{414}$ of the variable capacitance section $C_{400}$ are turned on, and the capacitance value of the variable capacitance section $C_{400}$ becomes $C_0$. On the other hand, when another nth signal voltage $V_{n3}$ has a value smaller than the reference voltage value $V_{ref}$, the amount of charges Q flowing into the variable capacitance section $C_{400}$ is smaller than $V_{ref}\cdot C_0$. For this reason, when any one of the switches $SW_{411}$ to $SW_{414}$ of the variable capacitance section $C_{400}$ is turned off, the integration signal output from the variable capacitance integration circuit 410 equals the reference voltage value $V_{ref}$.

As described above, the reference voltage value $V_{ref}$ output from the reference voltage hold circuit 300 and input to the comparison circuit $A_{402}$ defines the maximum value of the difference signal voltages $V_{n3}$ that can be A/D-converted by the A/D conversion circuit 400 without causing any saturation, i.e., the A/D conversion range. In addition, since one of the signal voltages $V_{n3}$ input to the A/D conversion circuit 400 always has the reference voltage value $V_{ref}$, the entire A/D conversion range can be effectively utilized. That is, the solid-state imaging device according to this embodiment is not saturated even when the incident light intensity is high and obtains an excellent resolution for A/D conversion even when the incident light intensity is low.

In addition, even when the image of only a spot light component is to be obtained by subtracting the image sensing result of a background light component from the image sensing result of the spot light component and background light component, like a case wherein the solid-state imaging device is used for a distance measuring device, and the background light component of the light incident on the photodiode PD is larger than the spot light component, the digital signal output from the A/D conversion circuit 400 on the basis of the spot light component obtained as the subtraction result has an excellent resolution.

Furthermore, in this embodiment, when both the spot light component and the background light component are incident on the photodiode PD, the variation amount $V_{n1}$ in signal voltage output from the integration circuit 10 during the predetermined period T is held by the capacitor $C_{22}$ of the CDS circuit 20. When only the background light component is incident on the photodiode PD, the variation amount $V_{n2}$ in signal voltage output from the integration circuit 10 during the predetermined period T is held by the capacitor $C_{23}$ of the CDS circuit 20. After that, the difference signal voltage $V_{n3}$ corresponding to the difference between the voltage value $V_{n1}$ and the voltage value $V_{n2}$ is obtained by the difference arithmetic circuit 30 and output from the S-H circuit 40. Hence, a noise component generated in the integration circuit 10 is removed from the voltage value $V_{n1}$ or $V_{n2}$ output for the CDS circuit 20 or the difference signal voltage $V_{n3}$ output from the S-H circuit 40.

(Second Embodiment)

Figure 12:
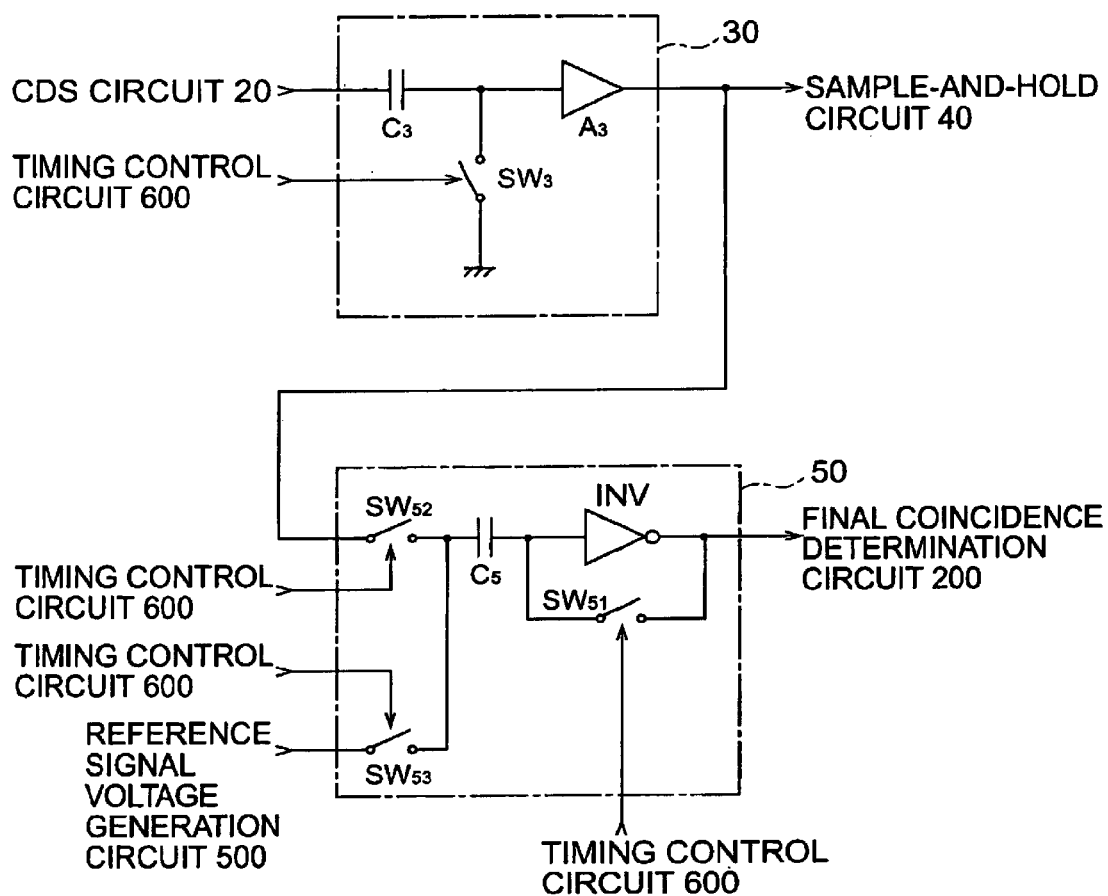
FIG. 12 is a circuit diagram of the difference arithmetic circuit and comparison circuit of a solid-state imaging device according to the second embodiment.

The arrangement of a solid-state imaging device according to the second embodiment will be described next. The solid-state imaging device according to the second embodiment is different from the first embodiment in the circuit arrangements of a difference arithmetic circuit 30 and comparison circuit 50. FIG. 12 is a circuit diagram of the difference arithmetic circuit 30 and comparison circuit 50 of the solid-state imaging device according to the second embodiment.

The difference arithmetic circuit 30 of each unit $100_n$ has a capacitor $C_3$ and amplifier $A_3$ sequentially between the input terminal and the output terminal. The connection point between the capacitor $C_3$ and the amplifier $A_3$ is grounded through a switch $SW_3$. When the switch $SW_3$ is ON, the difference arithmetic circuit 30 stores only charges Q1 in the capacitor $C_3$. When the switch $SW_3$ is OFF, the difference arithmetic circuit 30 removes charges Q2 from the capacitor C3. With this operation, the difference arithmetic circuit 30 holds the difference between the charges Q1 and Q2 input from a CDS circuit 20, i.e., charges (Q1−Q2) in the capacitor $C_3$ and outputs a signal voltage corresponding to the held charges (Q1−Q2) from the amplifier $A_3$. The switch $SW_3$ is turned on/off on the basis of a control signal output from a timing control circuit 600.

The comparison circuit 50 of each unit $100_n$ has two input terminals and one output terminal. The comparison circuit 50 has a switch $SW_{52}$ ($SW_{53}$), capacitor $C_5$, and inverter INV sequentially between the first (second) input terminal and the output terminals. A switch $SW_{51}$ is connected between the input and the output of the inverter INV. The switches $SW_{51}$ to $SW_{53}$ are turned on/off on the basis of a control signal output from the timing control circuit 600.

During the third period in which the difference between the charge amounts held in capacitors $C_{22}$ and $C_{23}$ of the CDS circuit 20 is obtained by the difference arithmetic circuit 30 and held by a S-H circuit 40, the comparison circuit 50 turns on the switch $SW_{51}$ to output the intermediate potential from the inverter INV and also turns on the switch $SW_{52}$ and off the switch $SW_{53}$ to hold a voltage value $V_{n3}$ output from the difference arithmetic circuit 30 by the capacitor $C_3$. During the fourth period following the third period, the comparison circuit 50 turns off the switches $SW_{51}$ and $SW_{52}$ and turns on the switch $SW_{53}$ to compare the value of the reference signal voltage output from a reference signal voltage generation circuit 500 with the voltage value $V_{n3}$ held by the capacitor $C_5$ and outputs a logic signal representing the comparison result. The logic of the logic signal output from the comparison circuit 50 is inverted at a timing when the value of the reference signal voltage coincides the voltage value $V_{n3}$ held by the capacitor $C_5$.

The operation and effect of the solid-state imaging device according to this embodiment are the same as in the first embodiment.

(Third Embodiment)

Figure 13:
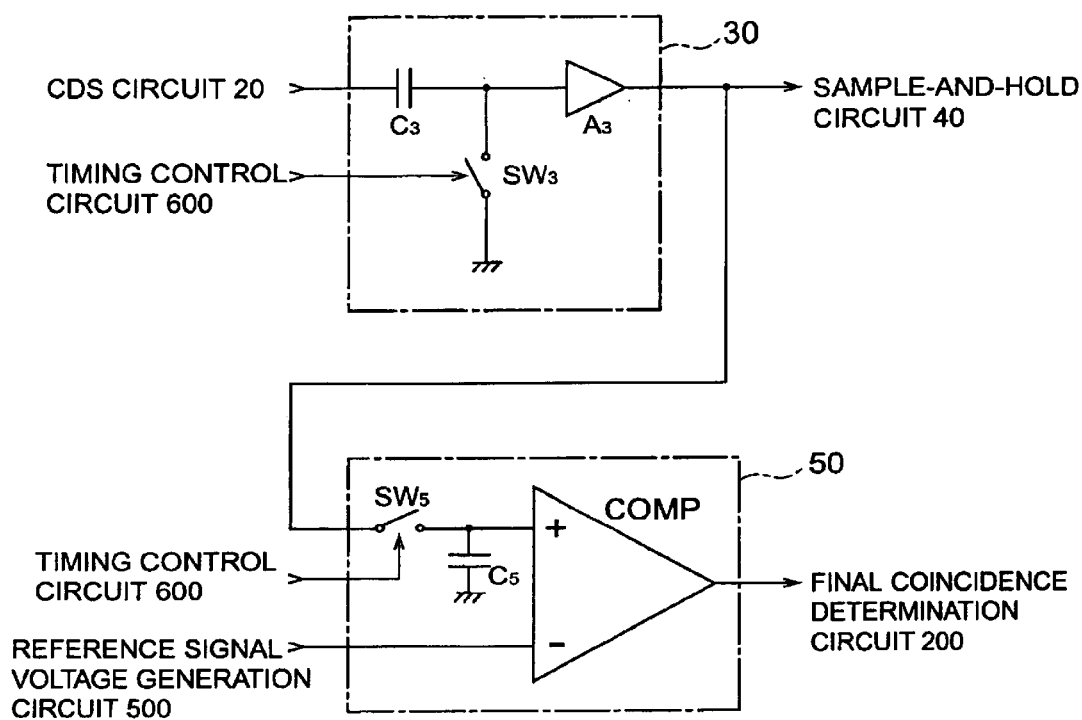
FIG. 13 is a circuit diagram of the difference arithmetic circuit and comparison circuit of a solid-state imaging device according to the third embodiment.

The arrangement of a solid-state imaging device according to the third embodiment will be described next. The solid-state imaging device according to the third embodiment is different from the second is embodiment in the circuit arrangement of a comparison circuit 50. FIG. 13 is a circuit diagram of a difference arithmetic circuit 30 and comparison circuit 50 of the solid-state imaging device according to the third embodiment.

The comparison circuit 50 of each unit $100_n$ has two input terminals and one output terminal, and also, a switch $SW_5$, capacitor $C_5$, and differential comparator COMP. The non-inverting input terminal of the differential comparator COMP is grounded through the capacitor $C_5$ and also connected, through the switch $SW_5$, to the first input terminal which receives the signal voltage output from the difference arithmetic circuit 30. The inverting input terminal of the differential comparator COMP is connected to the second input terminal which receives the reference signal voltage output from a reference signal voltage generation circuit 500. The switch $SW_5$ is turned on/off on the basis of a control signal output from a timing control circuit 600.

During the third period in which the difference between the charge amounts integrated in capacitors $C_{22}$ and $C_{23}$ of a CDS circuit 20 is obtained by the difference arithmetic circuit 30 and held by a S-H circuit 40, the comparison circuit 50 turns on the switch $SW_5$ to hold a voltage value $V_{n3}$ output from the difference arithmetic circuit 30 by a capacitor $C_3$. During the fourth period following the third period, the comparison circuit 50 turns off the switch $SW_5$ to compare, by the differential comparator COMP, the value of the reference signal voltage output from the reference signal voltage generation circuit 500 with the voltage value $V_{n3}$ held by the capacitor $C_5$ and outputs a logic signal representing the comparison result. The logic of the logic signal output from the comparison circuit 50 is inverted at a timing when the value of the reference signal voltage coincides the voltage value $V_{n3}$ held by the capacitor $C_5$.

The operation and effect of the solid-state imaging device according to this embodiment are the same as in the first embodiment. Especially, in this embodiment, since comparison is done by the differential comparator COMP without depending on any capacitor input, the influence of a parasitic capacitance is small, and the comparison accuracy is high.

Figure 14:
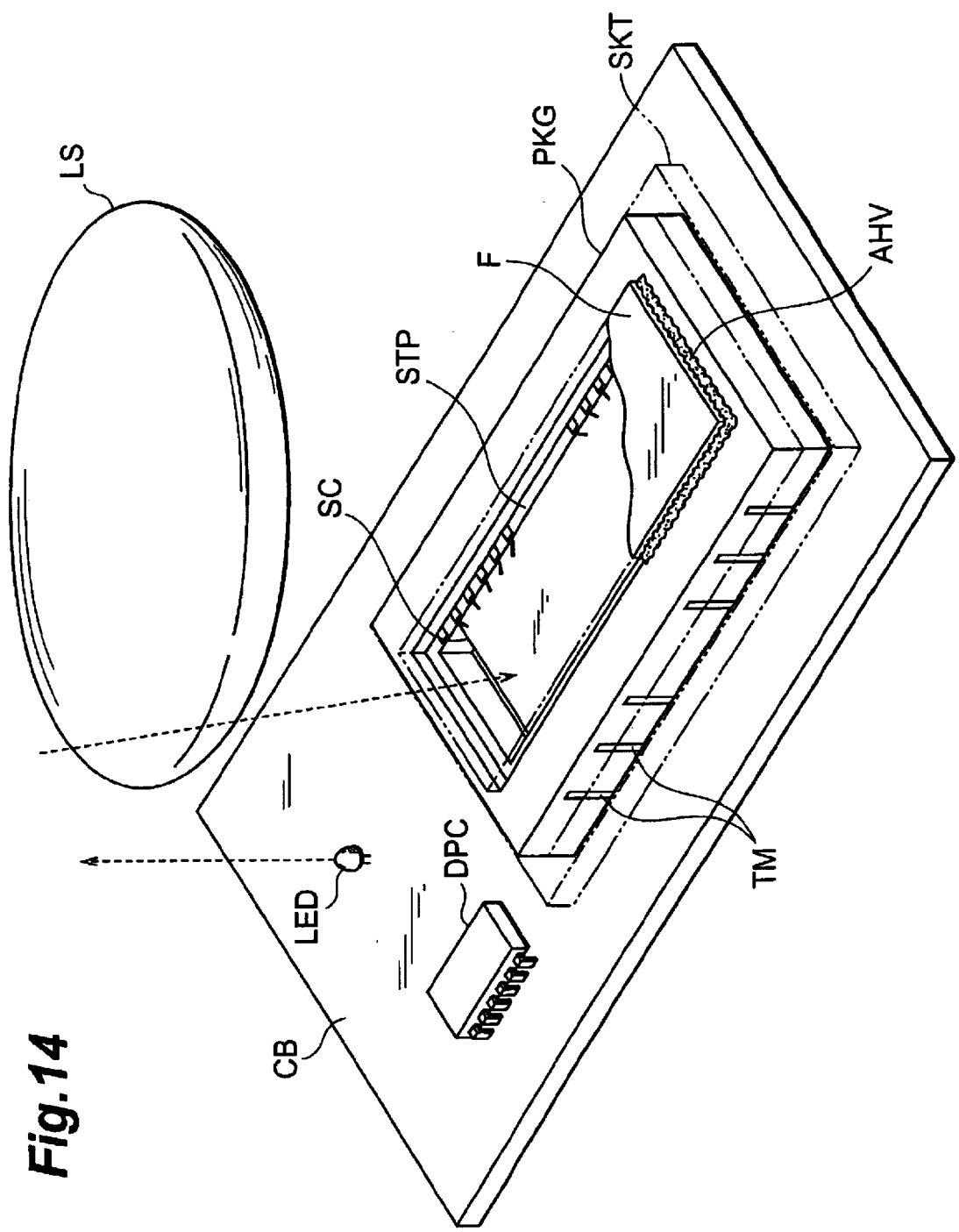
FIG. 14 is a perspective view of an imaging device having a solid-state imaging device.

FIG. 14 is a perspective view of a distance measuring device in which an imaging device having the above-described solid-state imaging device is mounted. The solid-state imaging device shown in FIG. 1 is formed from a semiconductor chip SC. In this imaging device, the semiconductor chip SC is accommodated in a package PKG made of a ceramic. An A/D conversion circuit 400 can be either formed in the semiconductor chip SC or connected to the outside of the semiconductor chip SC. when the semiconductor chip SC includes the A/D conversion circuit 400, output terminals TM of the A/D conversion circuit 400 are prepared on a side surface of the package PKG. Otherwise, the output terminals TM to output signals to be input to the A/D conversion circuit 400 are prepared.

The package PKO has a concave portion, and the semiconductor chip SC is arranged in the concave portion. A step portion STEP is formed in the inner surface of the concave portion. A filter F is arranged on the step portion STEP. The concave portion of the package PKG is closed by the filter F. The gap between the filter W and the package PKG is filled with an adhesive AHV. The filter F is an infrared filter which selectively transmits infrared rays and is made of Si. Note that the semiconductor chip SC is also made of Si.

Infrared rays transmitted through the filter F become incident on the array of photodiodes PD arranged on the surface of the semiconductor chip SC. An image signal corresponding to the incident image is output from the output terminal TM.

This imaging device is mounted on a circuit board CB. That is, a socket SKT is fixed on the circuit board CB, and the imaging device is fitted into the socket SKT such that the terminals TM come into contact with the inner surface of the socket SKT. A light source LED is also arranged on the circuit board CB. That is, this device has the light source LED which supplies light to be incident on the solid-state image sensing element SC, and the solid-state imaging device SC and light source LED are fixed on the single circuit board CB.

When the incident image is a light spot from the infrared light source LED arranged at the fixed position, the light spot incident position can be detected on the basis of the image signal. That is, the light source LED emits infrared rays to the object, reflected light from the object is focused by a lens LS to form a light spot on the semiconductor chip SC, the distance (incident position) of the light spot from the reference position is obtained on the basis of the image signal, and the distance to the object is calculated on the basis of the incident position. Note that the lens LS is fixed with respect to the circuit board CB.

For this arithmetic processing, the principle of triangulation can be used. That is, since the incident position of the light spot changes depending on the distance between the light source LED and the semiconductor chip SC, this device can be used for a distance measuring device. This arithmetic processing is executed by a digital processor mounted on the circuit board CB.

As has been described above in detail, according to the present invention, in each of the N units, a signal current corresponding to an incident light intensity is output from the photodetector, and the integration circuit integrates charges in accordance with the signal current output from the photodetector and outputs a signal voltage corresponding to the amount of the integrated charges. In the CDS circuit, the signal voltage output from the integration circuit is input to the first capacitor, and a charge amount corresponding to the amount of a change in input signal voltage is integrated in one of the second and third capacitors, which is selected by a switch means. The difference arithmetic circuit obtains the difference between the charge amounts integrated in the second and third capacitors of the CDS circuit and outputs a difference signal voltage corresponding to the difference. This difference signal voltage is held by the S-H circuit. The comparison circuit compares the value of the difference signal voltage obtained by the difference arithmetic circuit with the value of the reference signal voltage which is output from the reference signal voltage generation circuit and has a monotonically increasing value, and outputs a coincidence signal representing a timing when the two values coincide.

In addition, according to the present invention, the final coincidence determination circuit outputs a final coincidence signal representing the latest of timings represented by coincidence signals output from the N comparison circuits. The reference voltage hold circuit holds and outputs the value of the reference signal voltage at the timing indicated by the final coincidence signal. The held value of the reference signal voltage is the maximum value of difference signal voltages held by the N S-H circuits. The A/D conversion circuit sets the AID conversion range on the basis of the value of the reference signal voltage output from the reference voltage hold circuit, sequentially receives the difference signal voltages output from the N S-H circuits, converts each difference signal voltage into a digital signal, and outputs the digital signal.

Hence, even when the integration circuit has a noise variation that varies at every integration operation, the CDS circuit cancels the noise error. Even when the incident light intensity is high, no saturation occurs, and even when the incident light intensity is low, the resolution is excellent.

During the first period, charges corresponding to the spot light component (signal light component) and background light component are integrated in one of the second and third capacitors of the CDS circuit. During the second period, charges corresponding to the background light component are integrated in the other capacitor. During the third period, the difference (signal light component) between the charge amounts is obtained by the difference arithmetic circuit and held by the S-H circuit. Subsequently, during the fourth period, the reference signal voltage having a monotonically increasing value is output from the reference signal voltage generation circuit. On the basis of comparison between the values of the difference signal voltage and reference signal voltage, the comparison circuit outputs a coincidence signal representing a timing when the two values coincide. The final coincidence determination circuit outputs a final coincidence signal representing the latest of timings represented by coincidence signals. The reference voltage hold circuit holds the value of the reference signal voltage at the timing represented by the final coincidence signal. On the basis of the held value of the reference signal voltage, the A/D conversion range of the A/D conversion circuit is set. During the fifth period, difference signal voltages output from the N S-H circuits are sequentially input to the A/D conversion circuit, each difference signal voltage is converted into a digital signal, and the digital signal is output from the A/D conversion circuit. With this arrangement, the background light component is removed, and the S/N ratio of photodetection for a signal light component becomes high.

For the above solid-state imaging device, a solid-state imaging device having an A/D conversion circuit 400 to which output signals from a plurality of circuit arrays (PD, 10, 20, 30, 50, 40, and $SW_6$) are sequentially input is characterized in that each of the circuit arrays comprises a photodetector PD, and a comparison circuit 50 which receives a signal (output signal from a difference arithmetic circuit 30) corresponding to an output from the photodetector PD and a monotonically increasing voltage (output from a reference signal voltage generation circuit 500), and outputs a coincidence signal representing a timing when the signal and voltage coincide, the solid-state imaging device comprises a final coincidence determination circuit 200 which receives a plurality of coincidence signals output from the comparison circuits 50 and outputs a final coincidence signal representing the latest of timings represented by the coincidence signals, and the A/D conversion range of the A/D conversion circuit 400 is set in accordance with the value of the monotonically increasing voltage (output from the reference signal voltage generation circuit 500) when the final coincidence signal is output.

The final coincidence signal corresponds to a signal for the highest incident light intensity (light intensity) in signals corresponding to the outputs from the photodetectors PD. Hence, when the A/D conversion range is set on the basis of the final coincidence signal, any saturation can be prevented even when the incident light intensity is high, and an excellent resolution can be obtained even when the incident light intensity is low.

What is claimed is:

1. A solid-state imaging device having an A/D conversion circuit to which output signals from a plurality of circuit arrays are sequentially input, characterized in that each of the circuit arrays comprises a photodetector, and a comparison circuit which receives a signal corresponding to an output from the photodetector and a monotonically increasing voltage, and outputs a coincidence signal representing a timing when the signal and voltage coincide, said solid-state imaging device comprises a final coincidence determination circuit which receives a plurality of coincidence signals output from said comparison circuits and outputs a final coincidence signal representing a latest of timings represented by the coincidence signals, and an A/D conversion range of the A/D conversion circuit is set in accordance with a value of the monotonically increasing voltage when the final coincidence signal is output.

2. A solid-state imaging device characterized by comprising:

N ($N \geq 2$) photodetectors each of which outputs a signal current corresponding to an incident light intensity;

N integration circuits each of which is arranged in correspondence with one of said N photodetectors to integrate charges in correspondence with a signal current output from said photodetector and to output a signal voltage corresponding to an amount of the integrated charges;

N CDS circuits each of which is arranged in correspondence with one of said N integration circuits and has a first capacitor and amplifier sequentially inserted between an output terminal and an input terminal for receiving the signal voltage output from said integration circuit, second and third capacitors having the same capacitance value and parallelly inserted between an input and an output of said amplifier, and switch means for selecting one of said second and third capacitors to integrate a charge amount corresponding to an amount of a change in signal voltage;

N difference arithmetic circuits each of which is arranged in correspondence with one of said N CDS circuits to obtain a difference between the charge amounts integrated in said second and third capacitors of said CDS circuit and to output a difference signal voltage corresponding to the difference;

N S-H circuits each of which is arranged in correspondence with one of said N difference arithmetic circuits to hold and output the difference signal voltage obtained by said difference arithmetic circuit;

a reference signal voltage generation circuit which outputs a reference signal voltage having a monotonically increasing value;

N comparison circuits each of which is arranged in correspondence with one of said N difference arithmetic circuits to compare a value of the difference signal voltage obtained by said difference arithmetic circuit with the value of the reference signal voltage output from said reference signal voltage generation circuit and to output a coincidence signal representing a timing when the values coincide;

a final coincidence determination circuit which receives coincidence signals output from said N comparison circuits and outputs a final coincidence signal representing a latest of timings represented by the coincidence signals;

a reference voltage hold circuit which receives the final coincidence signal output from said final coincidence determination circuit and the reference signal voltage output from said reference signal voltage generation circuit and holds and outputs the value of the reference signal voltage at the timing represented by the final coincidence signal; and an A/D conversion circuit which sets an A/D conversion range on the basis of the value of the reference signal voltage output from said reference voltage hold circuit, sequentially receives the difference signal voltages output from said N S-H circuits, converts each difference signal voltage into a digital signal, and outputs the digital signal.

3. A solid-state imaging device according to claim 2, characterized in that said solid-state imaging device further comprises a timing control circuit which controls operations of said N integration circuits, said N CDS circuits, said N difference arithmetic circuits, said N S-H circuits, said reference signal voltage generation circuit, said N comparison circuits, said final coincidence determination circuit, said reference voltage hold circuit, and said A/D conversion circuit, and is used together with light projecting means for projecting spot light to an object, said timing control circuit causing, during a first period in which the spot light is being projected to the object by said light projecting means, said second capacitor of said CDS circuit to integrate the charge amount corresponding to the amount of the change in signal voltage output from said integration circuit when the spot light component and background light component become incident on said photodetector, during a second period in which the spot light is not projected to the object by said light projecting means, said third capacitor of said CDS circuit to integrate the charge amount corresponding to the amount of the change in signal voltage output from said integration circuit when the background light component becomes incident on said photodetector, during a third period after the first and second periods, said difference arithmetic circuit to calculate the difference between the charge amounts integrated in said second and third capacitors of said CDS circuit and to output the difference signal voltage corresponding to the difference, and said S-H circuit to hold the difference signal voltage, during a fourth period after the third period, said reference signal voltage generation circuit to output the reference signal voltage having the monotonically increasing value, said comparison circuit to output, on the basis of comparison between the values of the difference signal voltage and reference signal voltage, the coincidence signal representing the timing when the values coincide, said final coincidence determination circuit to output the final coincidence signal representing the latest of the timings represented by the coincidence signals, said reference voltage hold circuit to hold the value of the reference signal voltage at the timing represented by the final coincidence signal, and said A/D conversion circuit to set the A/D conversion range on the basis of the held value of the reference signal voltage, and during a fifth period after the fourth period, said A/D conversion circuit to sequentially receive the difference signal voltages output from said N S-H circuits, convert each difference signal voltage into a digital signal, and output the digital signal.

4. A distance measuring device characterized by comprising said solid-state imaging device of claim 2, and a light source which supplies light to be incident on said solid-state image sensing element, wherein said solid-state imaging device and said light source are fixed on a single circuit board.

* * * * *